US012628334B2

(12) United States Patent
Nam et al.

(10) Patent No.: US 12,628,334 B2
(45) Date of Patent: May 12, 2026

(54) SEMICONDUCTOR DEVICES

(71) Applicant: Samsung Electronics Co., Ltd.,
Suwon-si (KR)

(72) Inventors: Daejin Nam, Suwon-si (KR); Boreum Lee, Suwon-si (KR); Kongsoo Lee, Suwon-si (KR); Sunguk Jang, Suwon-si (KR)

(73) Assignee: Samsung Electronics Co., Ltd.,
Gyeonggi-do (KR)

( * ) Notice: Subject to any disclaimer, the term of this patent is extended or adjusted under 35 U.S.C. 154(b) by 523 days.

(21) Appl. No.: 18/338,711

(22) Filed: Jun. 21, 2023

(65) Prior Publication Data

US 2024/0057321 A1 Feb. 15, 2024

(30) Foreign Application Priority Data

Aug. 9, 2022 (KR) ......................... 10-2022-0098967

(51) Int. Cl.
*H10B 12/00* (2023.01)

(52) U.S. Cl.
CPC ........... *H10B 12/482* (2023.02); *H10B 12/02* (2023.02); *H10B 12/315* (2023.02); *H10B 12/485* (2023.02)

(58) Field of Classification Search
None
See application file for complete search history.

(56) References Cited

U.S. PATENT DOCUMENTS

| | | | |
|---|---|---|---|
| 6,281,084 B1 | 8/2001 | Akatsu et al. | |
| 6,479,853 B2 | 11/2002 | Chishiki | |
| 9,209,280 B2 | 12/2015 | Tsai et al. | |
| 10,784,266 B2 | 9/2020 | Kim et al. | |
| 10,797,056 B2 | 10/2020 | Kim et al. | |
| 11,728,410 B2 | 8/2023 | Kim et al. | |
| 2013/0062679 A1* | 3/2013 | Manabe ................. | H10B 12/03 |
| | | | 257/306 |
| 2019/0206873 A1* | 7/2019 | Kim ..................... | H10B 12/485 |
| 2020/0066729 A1* | 2/2020 | Simsek-Ege ......... | H10B 12/482 |
| 2020/0127103 A1 | 4/2020 | Kim et al. | |
| 2020/0161308 A1 | 5/2020 | Kim et al. | |

(Continued)

FOREIGN PATENT DOCUMENTS

| | | |
|---|---|---|
| KR | 100600052 B1 | 7/2006 |
| KR | 2007/0098319 A | 10/2007 |

(Continued)

OTHER PUBLICATIONS

Taiwan Office Action dated Apr. 8, 2024 for corresponding Taiwan Patent Application No. 112124220.

*Primary Examiner* — Steven M Page

(74) *Attorney, Agent, or Firm* — HARNESS, DICKEY & PIERCE, P.L.C.

(57) ABSTRACT

A semiconductor device may include a substrate including an active pattern, a conductive filling pattern on an impurity region at an upper portion of the active pattern, a first spacer and a second spacer stacked on a sidewall of the conductive filling pattern in a horizontal direction, and a bit line structure on the conductive filling pattern. The impurity region may include impurities. The horizontal direction may be parallel to an upper surface of the substrate. The first spacer may include an insulating material containing the impurities.

20 Claims, 30 Drawing Sheets

(56)     References Cited

U.S. PATENT DOCUMENTS

| | | | | |
|---|---|---|---|---|
| 2022/0102528 A1* | 3/2022 | Kim | ..................... | H10B 12/315 |
| 2023/0145857 A1* | 5/2023 | Lee | ........................ | G11C 5/063 |
| | | | | 257/296 |
| 2023/0422488 A1* | 12/2023 | Kim | ..................... | H10B 12/485 |

FOREIGN PATENT DOCUMENTS

| | | | |
|---|---|---|---|
| KR | 2022/0047547 A | 4/2022 |
| TW | 525261 B | 3/2003 |

* cited by examiner

A                                        A'

|←——————————————— l ———————————————→|

D2
⊗——→ D1

SEMICONDUCTOR DEVICES

CROSS-REFERENCE TO RELATED APPLICATION

This application claims priority under 35 U.S.C. § 119 to Korean Patent Application No. 10-2022-0098967 filed on Aug. 9, 2022 in the Korean Intellectual Property Office, the disclosure of which is hereby incorporated by reference in its entirety.

TECHNICAL FIELD

Example embodiments of the present disclosure relate to a semiconductor device. More particularly, example embodiments of the present disclosure relate to a DRAM device.

DISCUSSION OF RELATED ART

In a DRAM device, in order to electrically connect a bit line structure to an active pattern, an opening is formed to expose an upper surface of the active pattern, impurities are doped into an upper portion of the active pattern through the opening, and a conductive pattern is formed in the opening.

However, as the integration degree of the DRAM device increases, an area of the active pattern decreases, and thus impurities may not be highly doped into the upper portion of the active pattern through the opening.

SUMMARY

Example embodiments provide a semiconductor device having improved characteristics.

According to example embodiments of inventive concepts, a semiconductor device may include a substrate including an active pattern, the active pattern including an impurity region at an upper portion of the active pattern, the impurity region including impurities; a conductive filling pattern on the impurity region; a first spacer and a second spacer stacked on a sidewall of the conductive filling pattern in a horizontal direction, the horizontal direction being parallel to an upper surface of the substrate; and a bit line structure on the conductive filling pattern. The first spacer may include an insulating material containing the impurities.

According to example embodiments of inventive concepts, a semiconductor device may include a substrate including an active pattern protruding in a vertical direction from an upper surface of the substrate, the vertical direction being perpendicular to the upper surface of the substrate; an isolation pattern coveting a sidewall of the active pattern; a conductive filling pattern on the active pattern, an impurity region at a portion of the active pattern being under the conductive filling pattern, the conductive filling pattern including a metal, the impurity region including n-type impurities; a spacer structure on a sidewall of the conductive filling pattern, the spacer structure including an insulating material containing the n-type impurities; and a bit line structure on the conductive filling pattern.

According to example embodiments of inventive concepts, a substrate may include an active pattern protruding in a vertical direction from an upper surface of a substrate, the vertical direction being perpendicular to the upper surface of the substrate; an isolation pattern covering a sidewall of the active pattern; an ohmic contact pattern on a central portion of the active pattern, an impurity region at a portion of the active pattern being under the ohmic contact pattern, the impurity region including n-type impurities; a conductive filling pattern on the ohmic contact pattern; a spacer structure on a sidewall of the conductive filling pattern; a bit line structure on the conductive filling pattern; a conductive pad structure on each of opposite end portions of the active pattern, the conductive pad structure overlapping at least a portion of the conductive filling pattern in a horizontal direction, the horizontal direction being parallel to the upper surface of the substrate; a contact plug structure on the conductive pad structure; and a capacitor on the conductive pad structure. The spacer structure may include an insulating material containing the n-type impurities.

In a method of manufacturing the semiconductor device in accordance with example embodiments, an opening may be formed to expose an upper surface of an active pattern, a spacer layer including an insulating material containing impurities may be formed on a bottom and a sidewall of the opening, and a heat treatment process may be performed so that the impurities included in the spacer layer may diffuse into an upper portion of the active pattern to form an impurity region having a high impurity concentration. Thus, a cleaning process may not be performed before or after forming the impurity region, so that the damage of a portion of an isolation pattern adjacent to the active pattern due to the cleaning process may be limited and/or prevented. Accordingly, leakage current or an electric short through the isolation pattern may be reduced or prevented.

DETAILED DESCRIPTION

The above and other aspects and features of a semiconductor device and a method of forming the same in accordance with example embodiments will become readily understood from detail descriptions that follow, with reference to the accompanying drawings. It will be understood that, although the terms "first," "second," and/or "third" may be used herein to describe various materials, layers (films), regions, electrodes, pads, patterns, structures and processes, these materials, layers (films), regions, electrodes, pads, patterns, structures and processes should not be limited by these terms. These terms are only used to distinguish one material, layer (film), region, electrode, pad, pattern, structure and process from another material, layer (film), region, electrode, pad, pattern, structure and process. Thus, a first material, layer (film), region, electrode, pad, pattern, structure and process discussed below could be termed a second or third material, layer (film), region, electrode, pad, pattern, structure and process without departing from the teachings of inventive concepts.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 1:
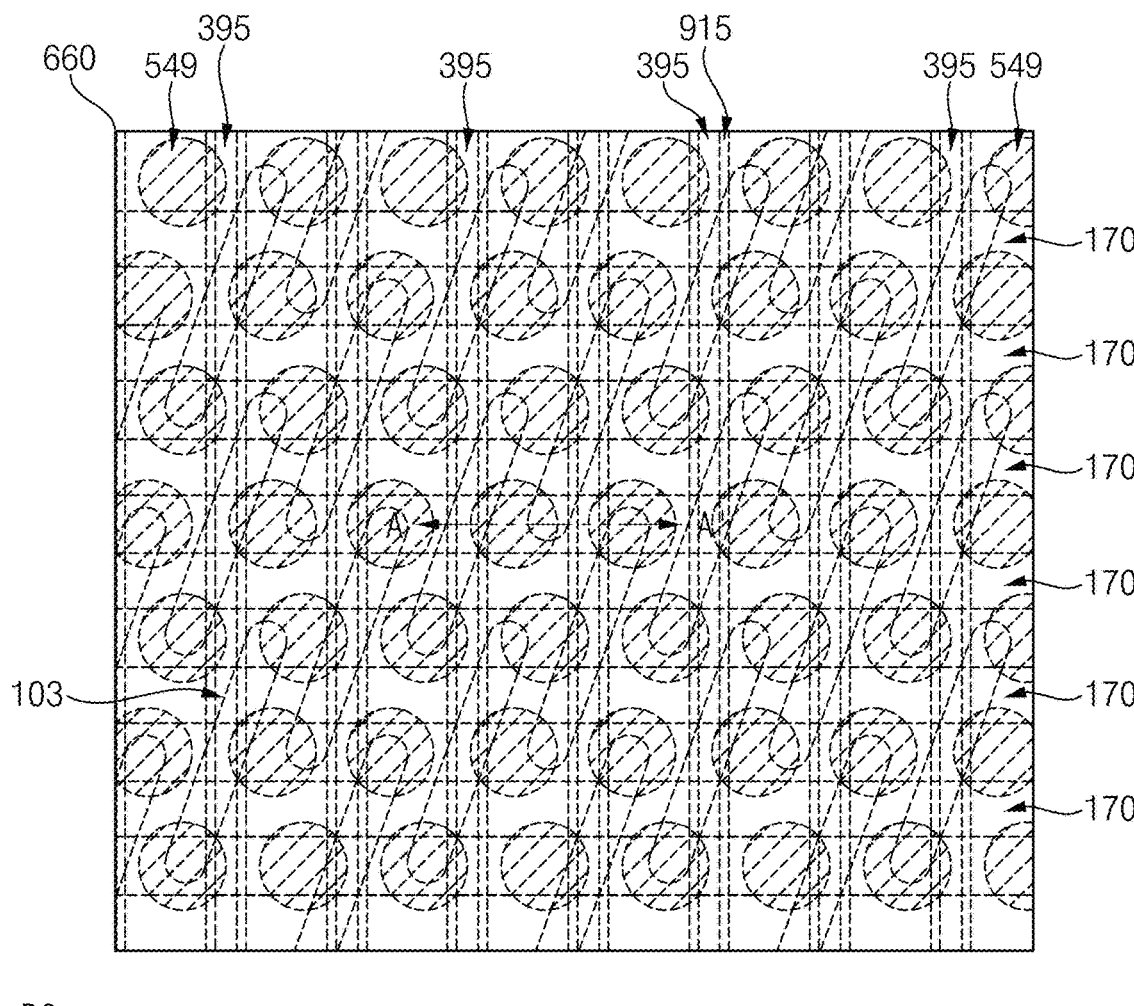
FIG. 1 is a plan view illustrating a semiconductor device in accordance with example embodiments.
Figure 1:
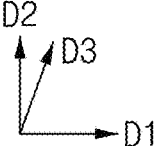
Figure 2:
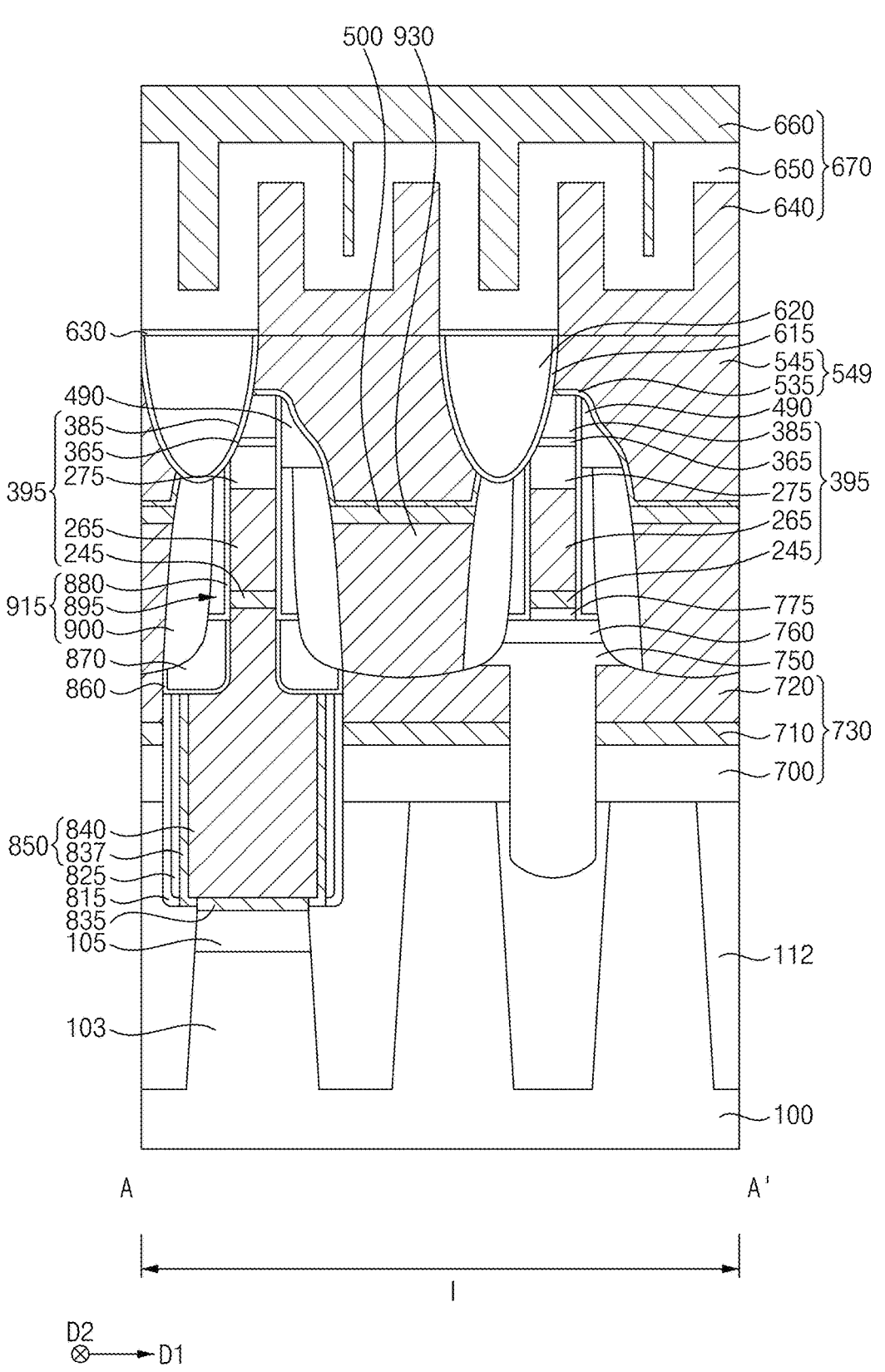
FIG. 2 is a cross-sectional view taken along line A-A' of FIG. 1.

FIG. 1 is a plan view illustrating a semiconductor device in accordance with example embodiments, and FIG. 2 is a cross-sectional view taken along line A-A' of FIG. 1.

Hereinafter, in the specification (and not necessarily in the claims), two directions that are substantially perpendicular to each other among horizontal directions, which are substantially parallel to an upper surface of a substrate, may be referred to as first and second directions D1 and D2, respectively, and a direction having an acute angle with respect to the first and second directions D1 and D2 among the horizontal directions may be referred to as a third direction D3.

Referring to FIGS. 1 and 2, the semiconductor device may include an active pattern 103, a gate structure 170, a first ohmic contact pattern 835, a filling structure, a bit line structure 395, a contact plug structure and a capacitor 670.

The semiconductor device may further include an isolation pattern 112, a conductive pad structure 730, first and second insulation pad layers 750 and 760, a third insulation pad 775, an upper spacer structure 915, a third capping pattern 940 (refer to FIG. 19), an insulation pattern structure, a second etch stop layer 630 and a fourth upper spacer 490.

The substrate 100 may include silicon, germanium, silicon-germanium, or a III-V group compound semiconductor, such as GaP, GaAs, or GaSb. In example embodiments, the substrate 100 may be a silicon-on-insulator (SDI) substrate or a germanium-on-insulator (GOI) substrate.

Figure 3:
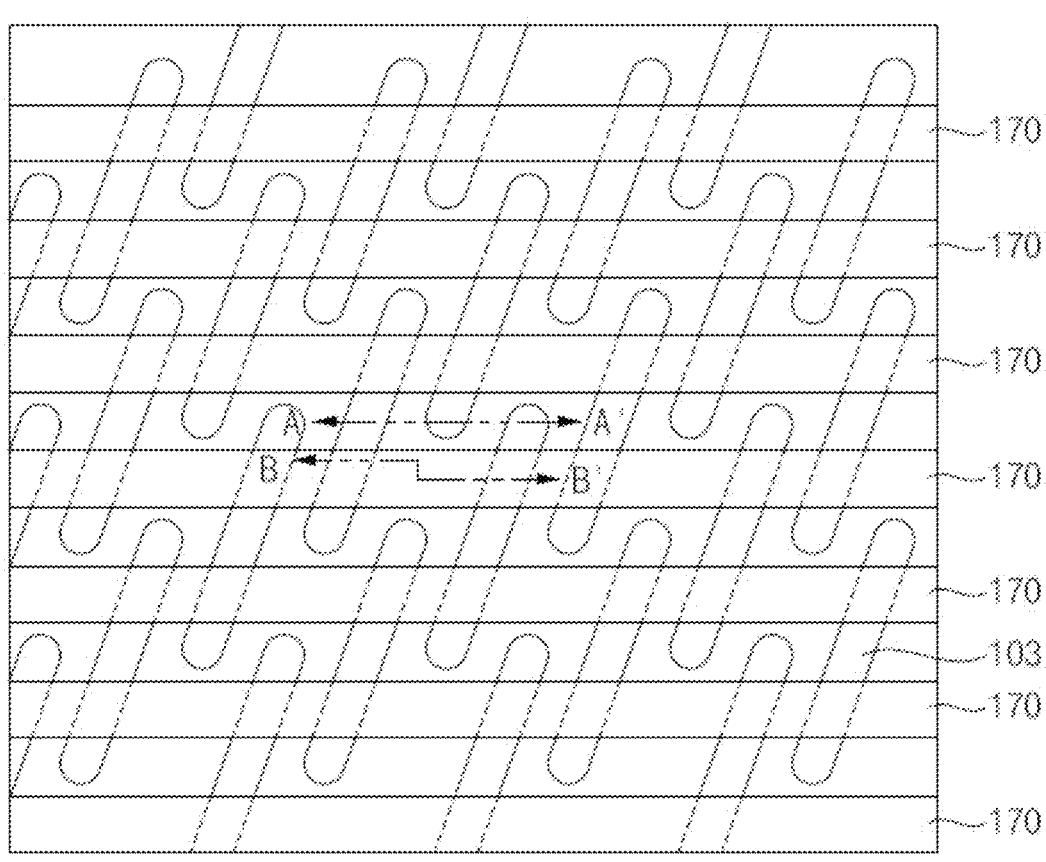
FIGS. 3 to 24 are plan views and cross-sectional views illustrating a method of manufacturing a semiconductor device in accordance with example embodiments.
Figure 3:
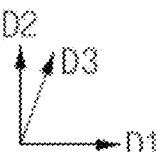

Referring to FIGS. 1 and 2 together with FIG. 3, the active pattern 103 may extend in the third direction D3, and a plurality of active patterns 103 may be spaced apart from each other in the first and second directions D1 and D2. A sidewall of the active pattern 103 may be covered by the isolation pattern 112. The active pattern 103 may include a material substantially the same as a material of the substrate 100, and the isolation pattern 112 may include an oxide, e.g., silicon oxide.

Figure 4:
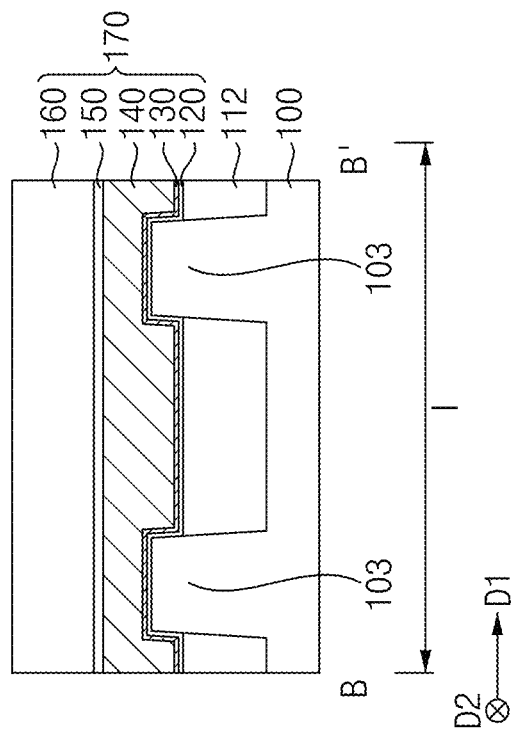
Figure 4:
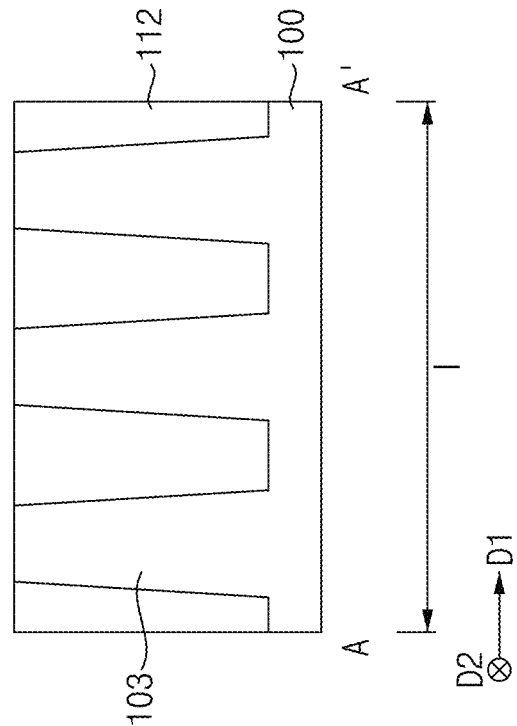

Referring to FIGS. 1 and 2 together with FIG. 4, the gate structure 170 may be formed in a second recess extending in the first direction D1 through upper portions of the active pattern 103 and the isolation pattern 112. The gate structure 170 may include a gate insulation pattern 120 on a bottom and a sidewall of the second recess, a first barrier pattern 130 on a portion of the gate insulation pattern 120 on the bottom and a lower sidewall of the second recess, a first conductive pattern 140 on the first barrier pattern 130 and filling a lower portion of the second recess, a second conductive pattern 150 on upper surfaces of the first barrier pattern 130 and the first conductive pattern 140, and a gate mask 160 on an upper surface of the second conductive pattern 150 and an upper inner sidewall of the gate insulation pattern 120 and filling an upper portion of the second recess. The first barrier pattern 130, the first conductive pattern 140 and the second conductive pattern 150 may collectively form a gate electrode.

The gate insulation pattern 120 may include an oxide, e.g., silicon oxide, the first barrier pattern 130 may include a metal nitride, e.g., titanium nitride, tantalum nitride, etc., the first conductive pattern 140 may include, e.g., a metal, a metal nitride, a metal silicide, etc., the second conductive pattern 150 may include, e.g., doped polysilicon, and the gate mask 160 may include a nitride, e.g., silicon nitride.

In example embodiments, the gate structure 170 may extend in the first direction D1, and a plurality of gate structures 170 may be spaced apart from each other in the second direction D2.

Figure 5:
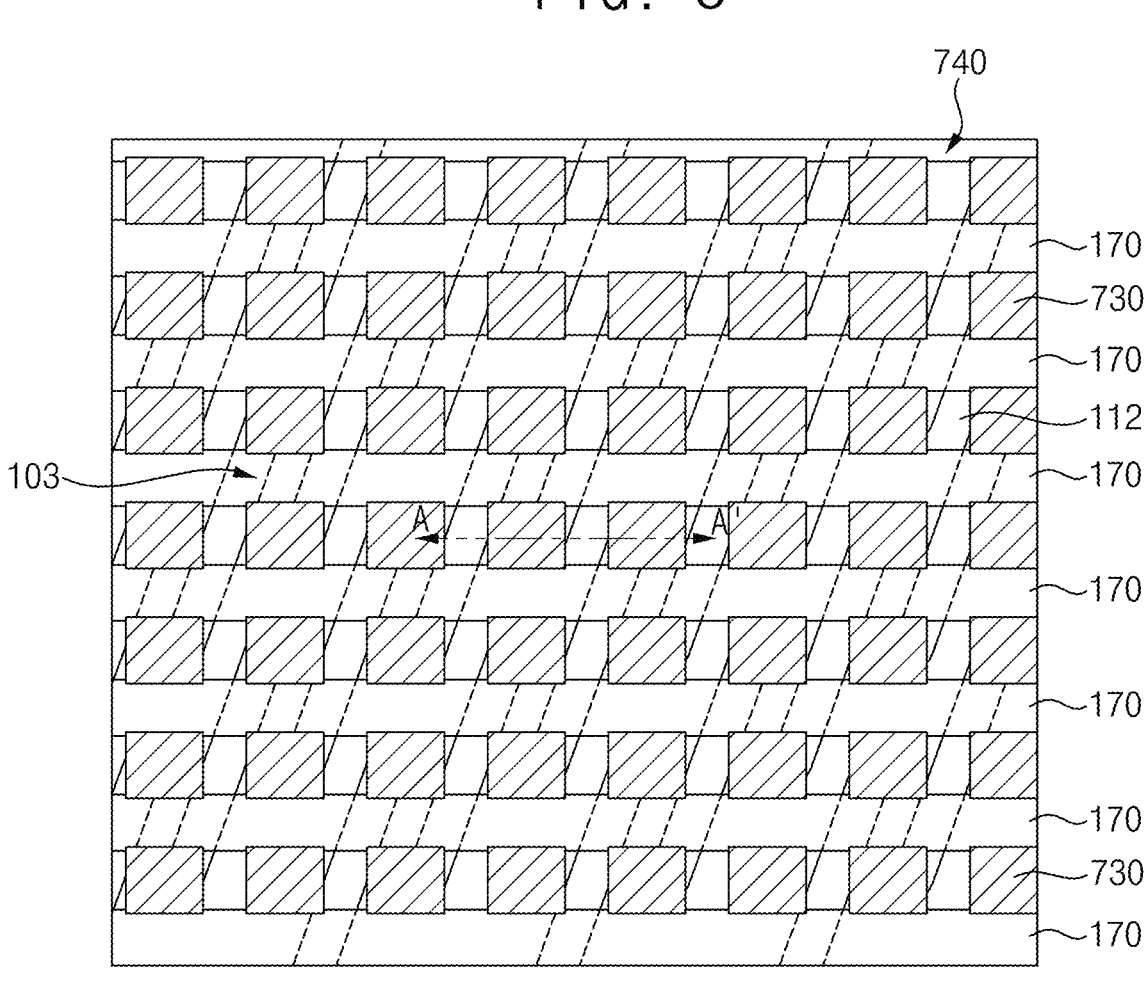
Figure 5:
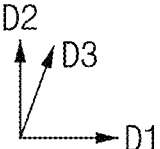
Figure 6:
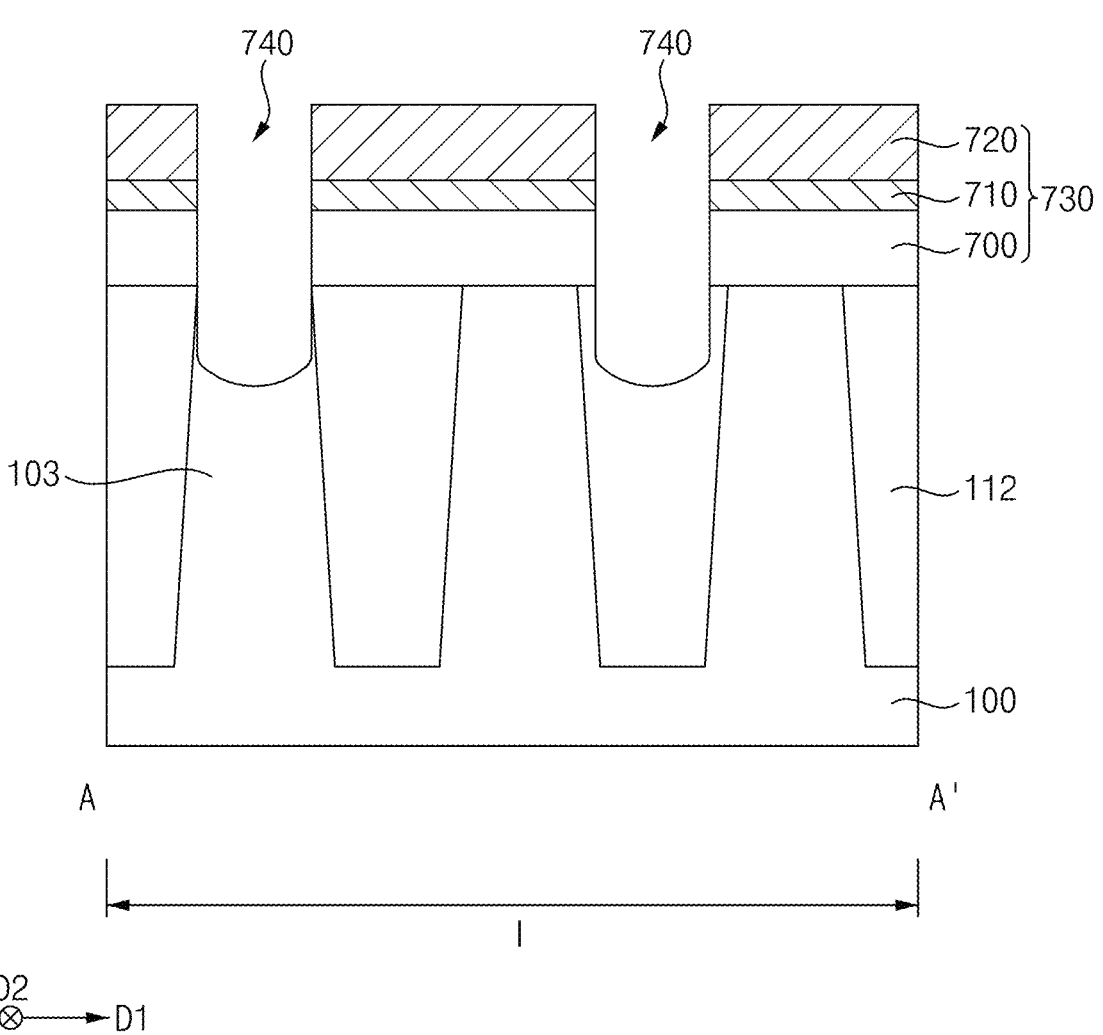

Referring to FIGS. 1 and 2 together with FIGS. 5 and 6, in example embodiments, a plurality of conductive pad structures 730 may be spaced apart from each other in the first and second directions D1 and D2, and may be arranged in a lattice pattern in a plan view.

In example embodiments, the conductive pad structure 730 may overlap in a vertical direction substantially perpendicular to the upper surface of the substrate 100 an end portion of the active pattern 103 extending in the third direction D3 and a portion of the isolation pattern 112 adjacent to the end portion of the active pattern 103 in the first direction D1.

In example embodiments, the conductive pad structure 730 may include first, second and third conductive pads 700, 710 and 720 sequentially stacked in the vertical direction. In example embodiments, the first conductive pad 700 may include doped polysilicon, the second conductive pad 710 may include a metal silicide, e.g., titanium silicide, cobalt silicide, nickel silicide, etc., a metal nitride, e.g., titanium nitride, tantalum nitride, tungsten nitride, etc., or a metal silicon nitride, e.g., titanium silicon nitride, tantalum silicon nitride, etc., and the third conductive pad 720 may include a metal, e.g., tungsten, ruthenium, etc. Thus, the conductive pad structure 730 may have a multi-layered structure.

Figure 8:
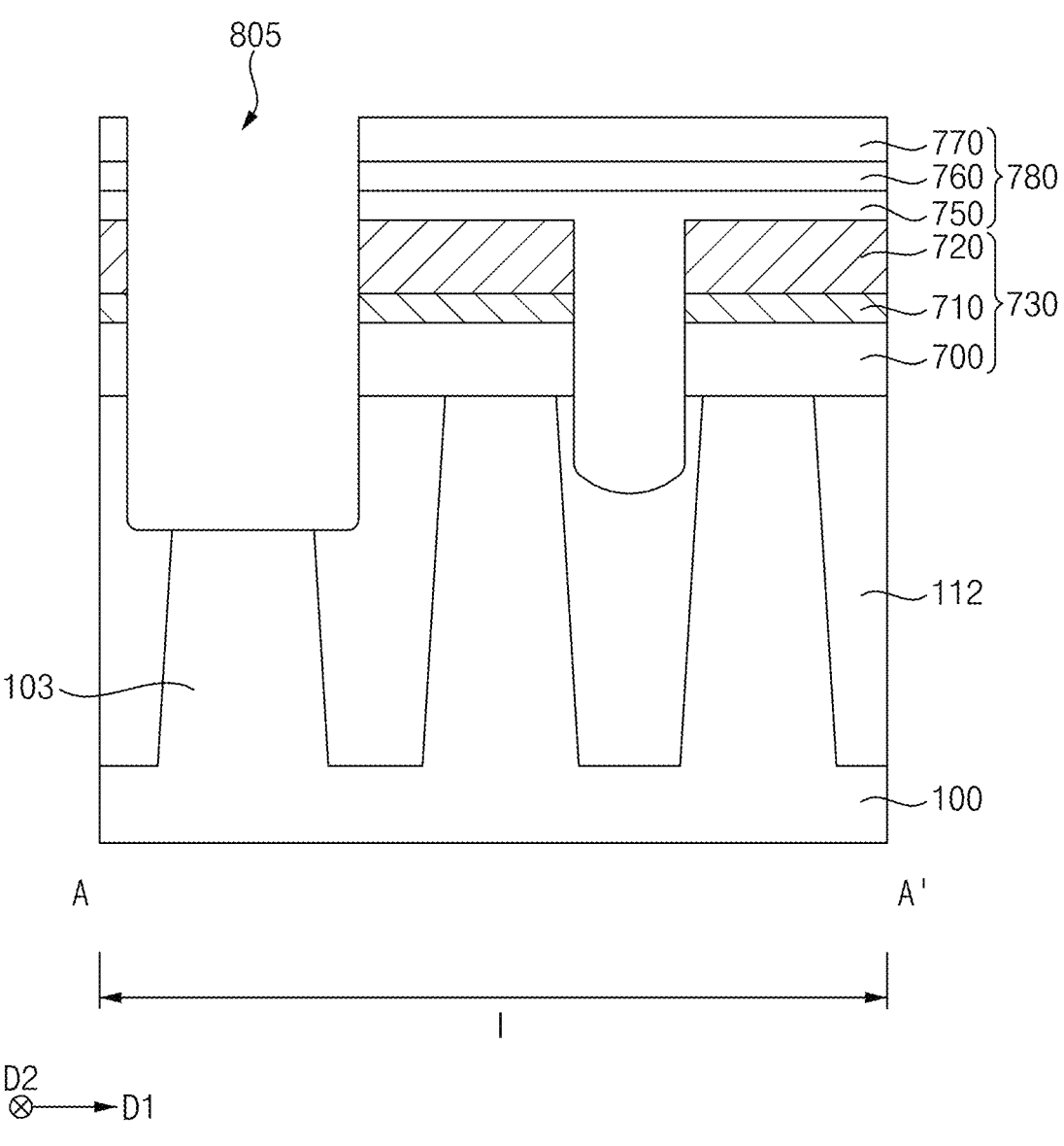

Referring to FIGS. 1 and 2 together with FIGS. 5, 6 and 8, in example embodiments, the first insulation pad layer 750 may be formed in a first opening 740 extending through the conductive pad structure 730 to expose an upper surface of the active pattern 103 or an upper surface of the isolation pattern 112, and the second insulation layer 760 and the third insulation pad 775 may be stacked on the first insulation pad layer 750. The first opening 740 may include a first portion extending in the first direction D1 and a second portion extending in the second direction D2, which may be connected with each other. Thus, the first insulation pad layer 750 in the first opening 740 may surround the conductive pad structure 730 arranged in a lattice pattern in a plan view.

In example embodiments, the first insulation pad layer 750 and the third insulation pad 775 may include an insulating nitride, e.g., silicon nitride, and the second insulation pad layer 760 may include a metal oxide, e.g., hafnium oxide, zirconium oxide, etc.

Figure 7:
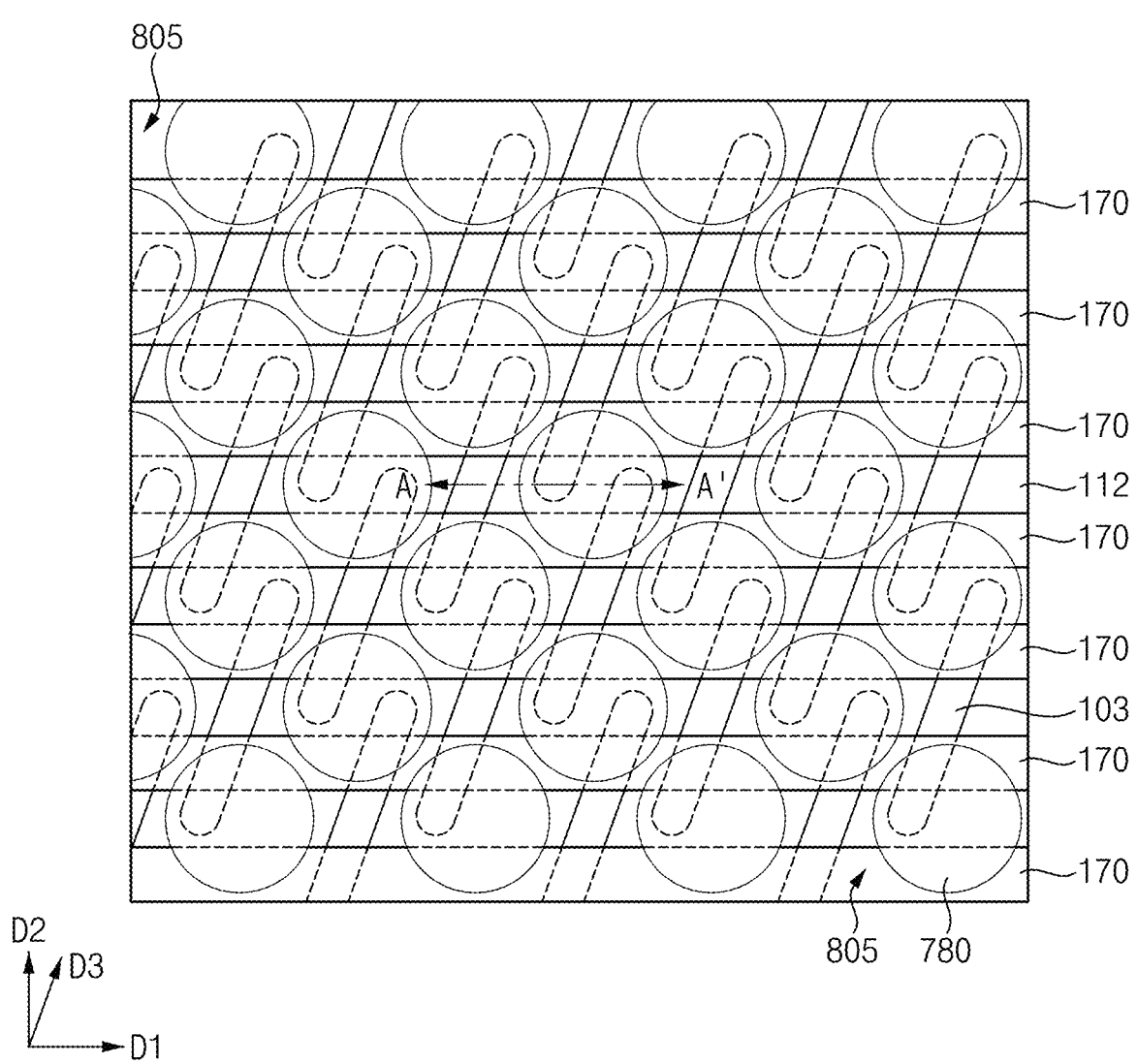

Referring to FIGS. 1 and 2 together with FIGS. 7 and 8, a second opening 805 may be formed through the conductive pad structure 730 to expose upper surfaces of the active pattern 103, the isolation pattern 112 and the gate mask 160 included in the gate structure 170, and an upper surface of a central portion of the active pattern 103 in the third direction D3 may be exposed by the second opening 805.

In an example embodiment, an area of a lower surface of the second opening 805 may be greater than an area of the upper surface of the active pattern 103 exposed by the second opening 805. Thus, the second opening 805 may also expose an upper surface of a portion of the isolation pattern 112 adjacent to the active pattern 103. Additionally, the second opening 805 may extend through an upper portion of the active pattern 103 and an upper portion of the isolation pattern 112 adjacent thereto, and thus a bottom of the second opening 805 may be lower than an upper surface of a portion of the active pattern 103 on which the second opening 805 is not formed, that is, an upper surface of each of opposite end portions in the third direction D3 of the active pattern 103.

In example embodiments, an impurity region 105 including n-type impurities, e.g., phosphorus, arsenic, etc., may be formed in an upper portion of the active pattern 103 under the second opening 805.

In example embodiments, the filling structure may include a conductive filling pattern 850, a lower spacer structure, a second capping pattern 860 and an insulating filling pattern 870.

In example embodiments, the conductive filling pattern 850 may include a lower portion having a relatively large width and an upper portion having a relatively small width. In example embodiments, the conductive filling pattern 850 may include a fourth conductive pattern 840 and a third conductive pattern 837 covering a sidewall of the fourth conductive pattern 840. An upper portion of the conductive filling pattern 850 may include only the fourth conductive pattern 840, and a lower portion of the conductive filling pattern 850 may include both of the third and fourth conductive patterns 837 and 840.

The third conductive pattern 837 may include a metal, e.g., titanium, cobalt, nickel, etc., and the fourth conductive pattern 840 may include a metal, e.g., tungsten, titanium, tantalum, etc., or a metal nitride, e.g., titanium nitride, tantalum nitride, tungsten nitride, etc.

In example embodiments, the first ohmic contact pattern 835 may be formed between the impurity region 105 and the fourth conductive pattern 840. The first ohmic contact pattern 835 may include silicide of a metal of the third conductive pattern 837, e.g., titanium silicide, cobalt silicide, nickel silicide, etc.

The lower spacer structure may cover a sidewall of the conductive filling pattern 850, and may include a second lower spacer 825 and a first lower spacer 815 stacked in the horizontal direction from the sidewall of the conductive filling pattern 850.

In example embodiments, the first lower spacer 815 may include an insulating material containing impurities, and the second lower spacer 825 may include a low-k dielectric material or a nitride. For example, the first lower spacer 815 may include phosphorous silicate glass (PSG), and the second lower spacer 825 may include silicon oxycarbide or silicon nitride.

In an example embodiment, an upper surface of the lower portion of the conductive filling pattern 850 may be substantially coplanar with an uppermost surface of the first and second lower spacers 815 and 825.

The second capping pattern 860 may cover a sidewall of the upper portion of the conductive filling pattern 850 and the upper surface of the lower portion of the conductive filling pattern 850, and the insulating filling pattern 870 may be formed on the second capping pattern 860. The second capping pattern 860 may include an oxide, e.g., silicon oxide or an insulating nitride, e.g., silicon nitride, and the insulating filling pattern 870 may include an insulating nitride, e.g., silicon nitride.

The bit line structure 395 may include an adhesion pattern 245, a fifth conductive pattern 265, a second mask 275, a first etch stop pattern 365 and a first capping pattern 385 sequentially stacked in the vertical direction on the filling structure. The adhesion pattern 245 and the fifth conductive pattern 265 may form a conductive structure, and the second mask 275, the first etch stop pattern 365 and the first capping pattern 385 may form an insulation structure. In an example embodiment, the second mask 275, the first etch stop pattern 365 and the first capping pattern 385 sequentially stacked may be merged with each other to form a single insulation structure.

The adhesion pattern 245 may include a metal silicon nitride, e.g., titanium nitride, tantalum nitride, tungsten nitride, etc., the fifth conductive pattern 265 may include a metal, e.g., tungsten, titanium, tantalum, ruthenium, etc., and each of the second mask 275, the first etch stop pattern 365 and the first capping pattern 385 may include an insulating nitride, e.g., silicon nitride.

In example embodiments, the bit line structure 395 may extend in the second direction D2 on the filling structure and the third insulation pad 775, and a plurality of bit line structures 395 may be spaced apart from each other in the first direction D1.

The adhesion pattern 245 may be formed between the third insulation pad 775 including an insulating nitride, e.g., silicon nitride and the fifth conductive pattern 265 including a metal, e.g., tungsten, and the third insulation pad 775 and the fifth conductive pattern 265 may be well attached to each other.

The contact plug structure may include a lower contact plug 930, a second ohmic contact pattern 500 and an upper contact plug 549 sequentially stacked in the vertical direction on the conductive pad structure 730.

The lower contact plug 930 may contact the third conductive pad 720 so as to be electrically connected to the active pattern 103, particularly, each of end portions in the third direction D3 of the active pattern 103. In example embodiments, a plurality of lower contact plugs 930 may be spaced apart from each other in the second direction D2 between the bit line structures 395, and the third capping pattern 940 may be formed between neighboring ones of the lower contact plugs 930 in the second direction D2. The third capping pattern 940 may include an insulating nitride, e.g., silicon nitride.

The lower contact plug 930 may include, e.g., doped polysilicon, the second ohmic contact pattern 500 may include, e.g., titanium silicide, cobalt silicide, nickel silicide, etc.

In an example embodiment, the upper contact plug 549 may include a seventh conductive pattern 545 and a second barrier pattern 535 covering a lower surface of the seventh conductive pattern 545. In example embodiments, a plurality of upper contact plugs 549 may be spaced apart from each other in the first and second directions D1 and D2, and may be arranged in a honeycomb pattern or a lattice pattern in a plan view. Each of the upper contact plugs 549 may have a shape of, e.g., a circuit, an ellipse or a polygon.

The upper spacer structure 915 may include a first upper spacer 880 covering a sidewall of the bit line structure 395 and upper surfaces of portions of the second capping pattern 860 and the insulating filling pattern 870, an air spacer 895 on an outer sidewall of the first upper spacer 880, and a third upper spacer 900 covering an outer sidewall of the second upper spacer 890 and upper surfaces of portions of the second capping pattern 860 and the insulating filling pattern 870.

The first upper spacer 880 may include an insulating nitride, e.g., nitride, the air spacer 895 may include air, and the third upper spacer 900 may include an insulating nitride, e.g., silicon nitride.

The fourth upper spacer 490 may be formed on an outer sidewall of a portion of the first upper spacer 880 on an upper sidewall of the bit line structure 395, and may cover a top end of the air spacer 895 and an upper surface of at least a portion of the third upper spacer 900.

Figure 23:
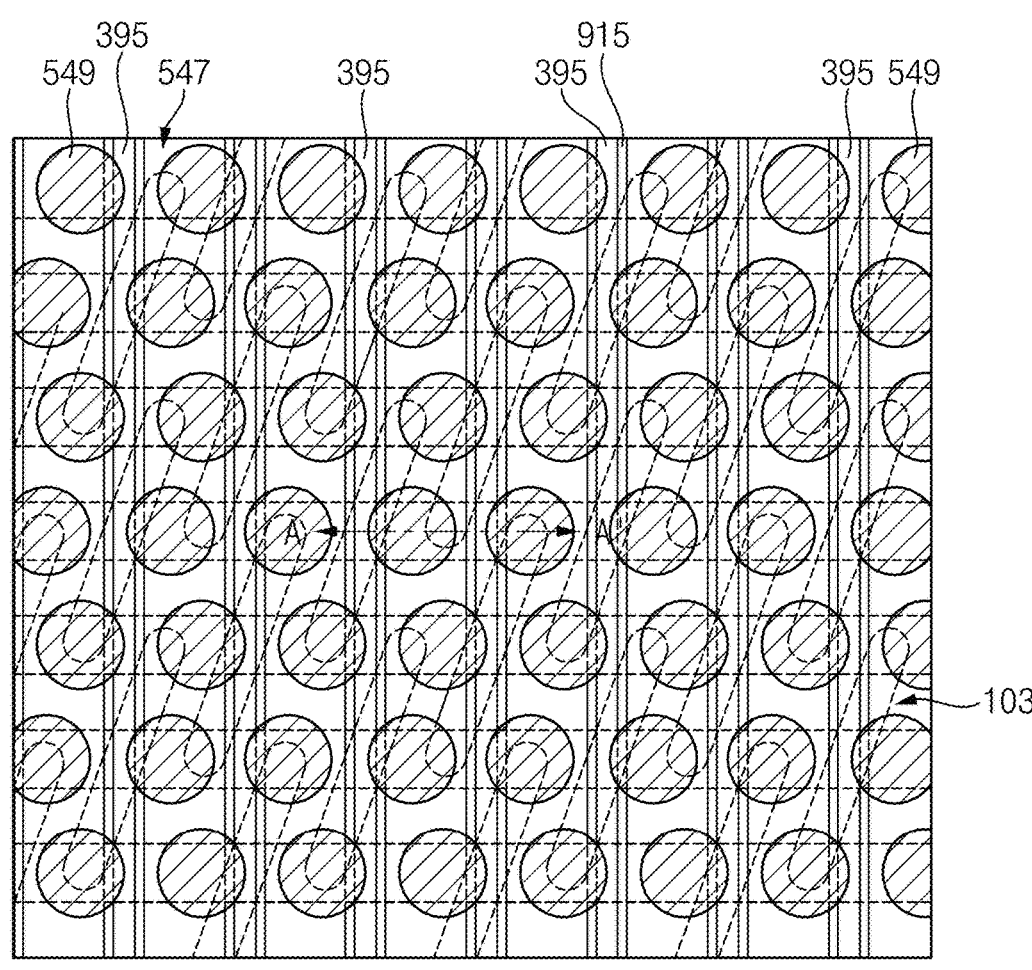
Figure 23:
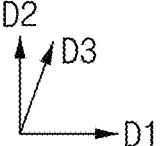
Figure 24:
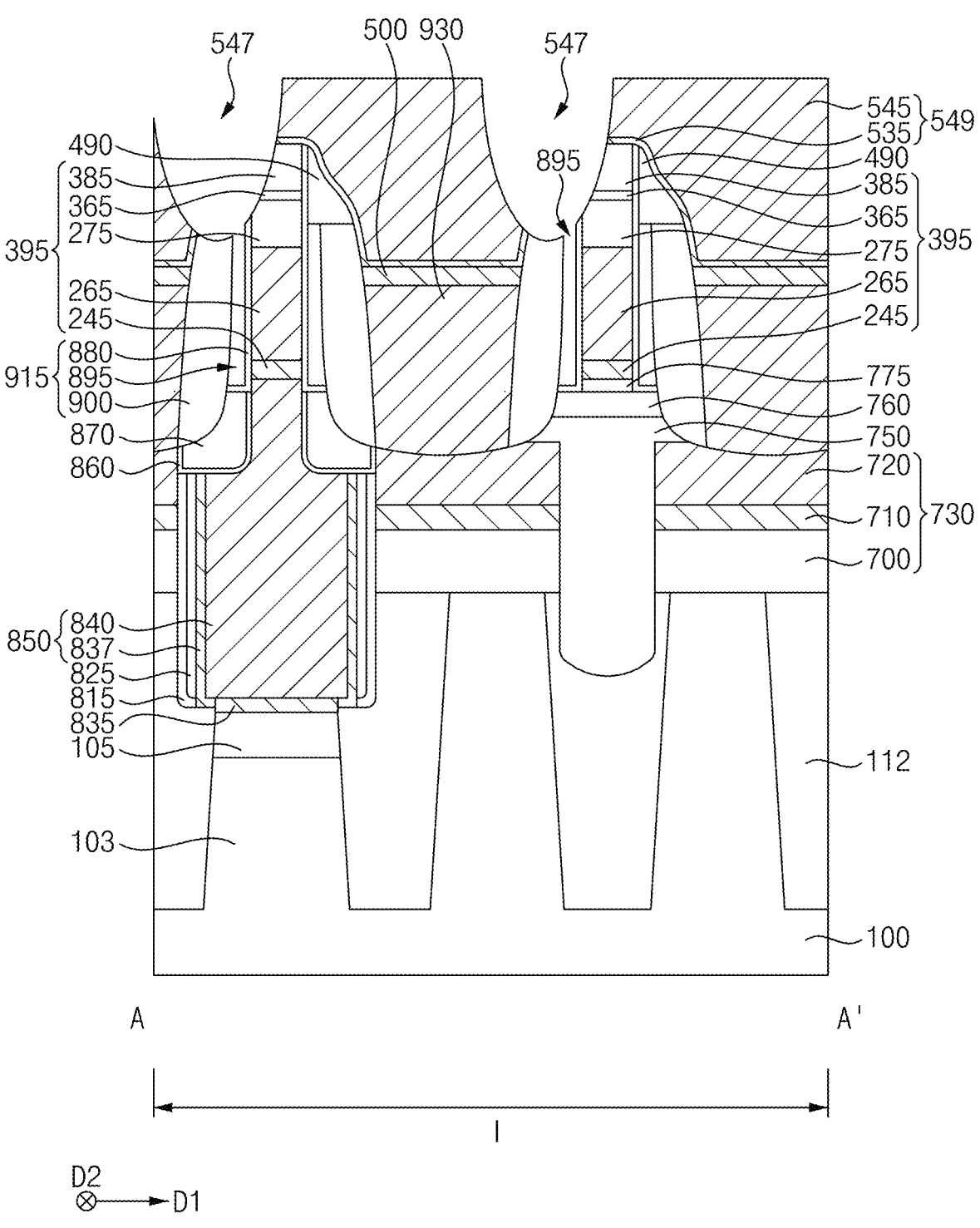

Referring to FIGS. 1 and 2 together with FIGS. 23 and 24, the insulation pattern structure may include a first insulation pattern 615 and a second insulation pattern 620. The first insulation pattern 615 may be formed on an inner wall of a seventh opening 547 extending through the upper contact plug 549, a portion of the insulation structure included in the bit line structure 395 and first, third and fourth upper spacers 880, 900 and 490, and surrounding the upper contact plug 549. The second insulation pattern 620 may be formed on the first insulation pattern 615, and may fill a remaining portion of the seventh opening 547. The top end of the air spacer 895 may be closed by the first insulation pattern 615.

The first and second insulation patterns 615 and 620 may include an insulating nitride, e.g., silicon nitride.

The fourth etch stop layer 630 may be formed on the first and second insulation patterns 615 and 620, the upper contact plug 549 and the third capping pattern 940.

The capacitor 670 may be formed on the upper contact plug 549, and may include a lower electrode 640 having a pillar shape or a cylindrical shape, a dielectric layer 650 on a surface of the lower electrode 640, and an upper electrode 660 on the dielectric layer 650.

The lower electrode 640 may include, e.g., a metal, a metal nitride, a metal silicide, doped polysilicon, the dielectric layer 650 may include, e.g., a metal oxide, and the upper electrode 660 may include, e.g., a metal, a metal nitride, a metal silicide, doped silicon-germanium, etc. In an example embodiment, the upper electrode 660 may include a first electrode including a metal or a metal nitride, and a second upper electrode including doped silicon-germanium.

In the semiconductor device, the impurity region 105 may be formed in the upper portion of the active pattern 103 under the conductive filling pattern 850 under the bit line structure 395, and the first ohmic contact pattern 835 may be formed between the impurity region 105 and the conductive filling pattern 850.

The impurity region 105 may include impurities diffused from a first lower spacer layer 810 (refer to FIGS. 9 and 10) for forming the first lower spacer 815. As described below, the impurity region 105 may include impurities having a high concentration, and thus a resistance between the conductive filling pattern 850 and the active pattern 103 may decrease. Additionally, the first ohmic contact pattern 835 may be formed between the impurity region 105 including doped polysilicon and the conductive filling pattern 850 including a metal, and thus a resistance between the impurity region 105 and the conductive filling pattern 850 may decrease.

Furthermore, as described below, before or after forming the impurity region 105, a cleaning process or a stripping process is not performed, and thus a portion of the isolation pattern 112 adjacent to the active pattern 103 may not be removed, so that leakage current or electric short may not occur.

FIGS. 3 to 24 are plan views and cross-sectional views illustrating a method of manufacturing a semiconductor device in accordance with example embodiments. Particularly, FIGS. 3, 5, 7, 19 and 23 are the plan views, FIG. 4 includes cross-sections taken along lines A-A' and B-B' of FIG. 3, and FIGS. 6, 8-18, 20-22 and 24 are cross-sectional views taken along lines A-A' of corresponding plan views, respectively.

Referring to FIGS. 3 and 4, an active pattern 103 may be formed on a substrate 100, and an isolation pattern 112 may be formed to cover a sidewall of the active pattern 103.

The active pattern 103 may be formed by removing an upper portion of the substrate 100 to form a first recess, and a plurality of active patterns 103 each of which may extend in the third direction D3 may be formed to be spaced apart from each other in the first and second directions D1 and D2.

The active pattern 103 and the isolation pattern 112 may be partially etched to form a second recess extending in the first direction D1.

A gate structure 170 may be formed in the second recess. In example embodiments, the gate structure 170 may extend in the first direction D1, and a plurality of gate structures 170 may be formed to be spaced apart from each other in the second direction D2.

Referring to FIGS. 5 and 6, a conductive pad structure 730 may be formed on the active pattern 103 and the isolation pattern 112.

The conductive pad structure 730 may include first, second and third conductive pads 700, 710 and 720 sequentially stacked in the vertical direction.

The conductive pad structure 730 may be patterned by an etching process to form a first opening 740 exposing upper surfaces of the active pattern 103, the isolation pattern 112 and the gate structure 170, and during the etching process, upper portions of the active pattern 103 and the isolation pattern 112 may also be partially removed.

In example embodiments, the first opening 740 may include a first portion extending in the first direction D1 and a second portion extending in the second direction D2 that may be connected with each other. Thus, a plurality of conductive pad structures 730 may be spaced apart from each other to be arranged in a lattice pattern in a plan view.

In example embodiments, the conductive pad structure 730 may overlap in the vertical direction an end portion of the active pattern 103 extending in the third direction D3 and a portion of the isolation pattern 112 adjacent thereto in the first direction D1.

Referring to FIGS. 7 and 8, an insulating pad layer structure 780 may be formed on the conductive pad structure 730 to fill the first opening 740.

In example embodiments, the insulating pad layer structure 780 may include first, second and third insulation pad layers 750, 760 and 770 sequentially stacked, and the first insulation pad layer 750 may fill the first opening 740.

A first mask (not shown) may be formed on the insulating pad layer structure 780, and the insulating pad layer structure 780, the conductive pad structure 730, the active pattern 103, the isolation pattern 112 and the gate mask 160 included in the gate structure 170 may be partially etched by an etching process using the first mask as an etching mask to form a second opening 805. An upper surface of a portion of the active pattern 103 and a portion of the isolation pattern 112 adjacent thereto may be exposed by the second opening 805.

In example embodiments, the first mask may have a shape of, e.g., a circle or an ellipse in a plan view, and a plurality of first masks may be spaced apart from each other in the first and second directions D1 and D2. Each of the first masks may overlap in the vertical direction end portions of neighboring ones of the active patterns 103 in the first direction D1 and a portion of the isolation pattern 112 therebetween.

In example embodiments, an upper surface of a central portion in the third direction D3 of the active pattern 103 may be exposed by the second opening 805.

The first mask may be removed.

Figure 9:
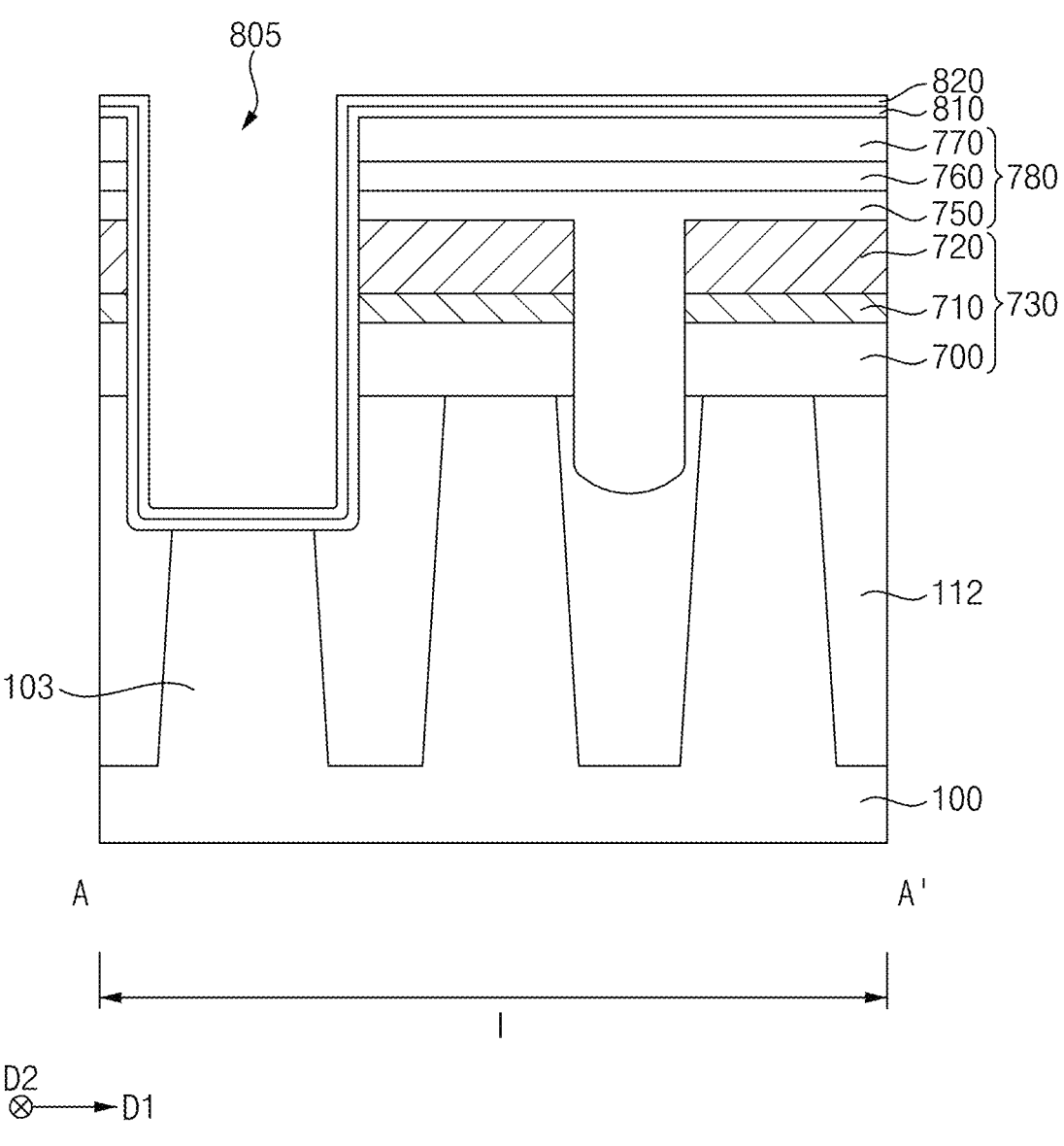

Referring to FIG. 9, first and second lower spacer layers 810 and 820 may be sequentially formed on the upper surfaces of the active pattern 103 and the isolation pattern 112 exposed by the second opening 805, a sidewall of the second opening 805 and an upper surface of the insulating pad layer structure 780.

In example embodiments, the first lower spacer layer 810 may include an insulating material containing n-type impurities, e.g., phosphorous. For example, the first lower spacer layer 810 may include PSG.

In example embodiments, the second lower spacer layer 820 may include a low-k dielectric material or a nitride. For example, the second lower spacer layer 820 may include silicon oxycarbide or silicon nitride.

Figure 10:
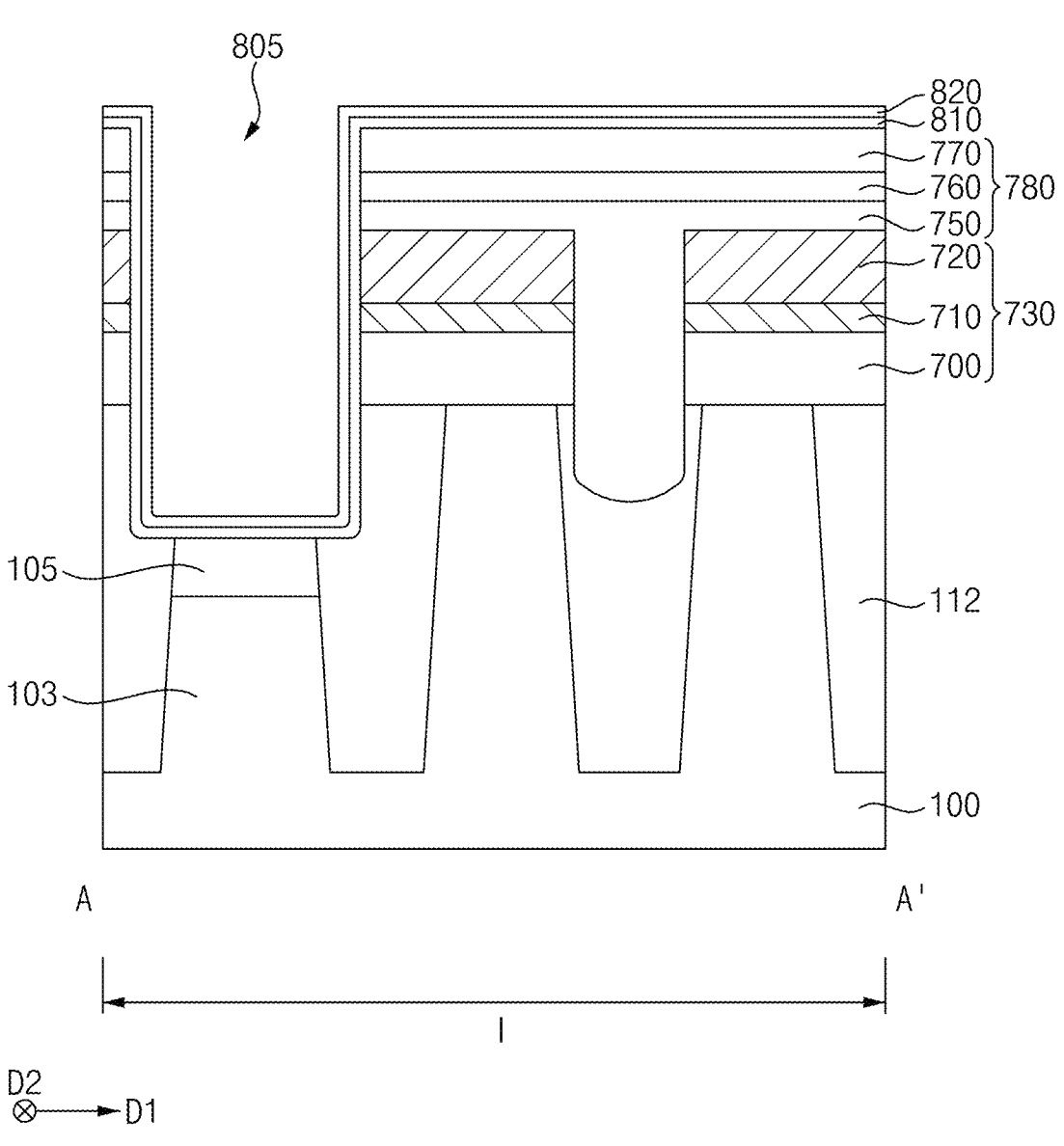

Referring to FIG. 10, a heat treatment process may be performed on the substrate 100 having the first and second lower spacer layers 810 and 820 thereon, and the n-type impurities, e.g., phosphorous included in the first lower spacer layer 810 may diffuse into an upper portion of the active pattern 103.

Thus, an impurity region 105 may be formed in the upper portion of the active pattern 103 contacting the first lower spacer layer 810.

Figure 11:
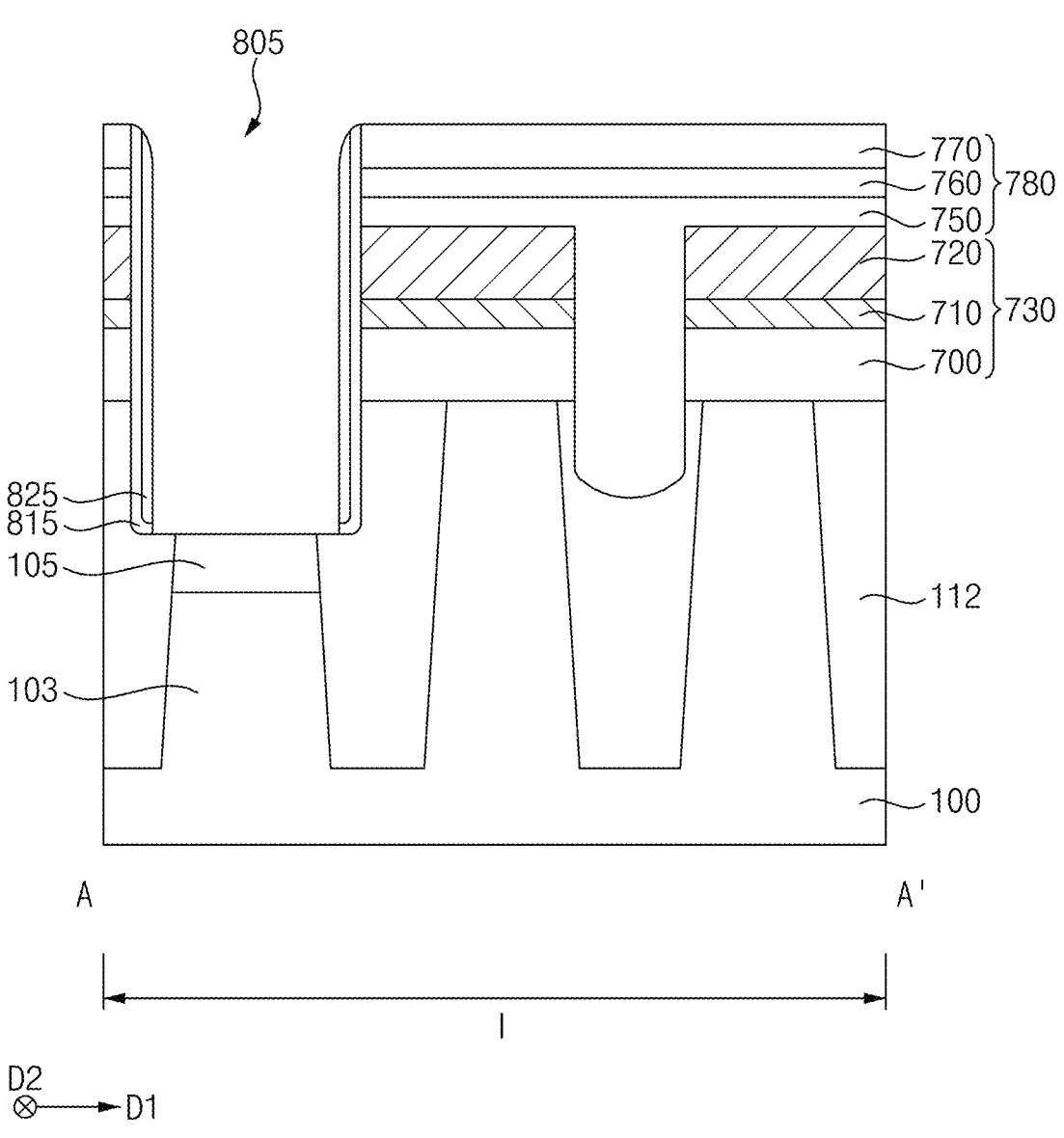

Referring to FIG. 11, an anisotropic etching process may be performed on the first and second lower spacer layers 810 and 820.

Thus, a lower spacer structure including first and second lower spacers 81_5 and 825 stacked on the sidewall of the second opening 805 may be formed, and the upper surface of the active pattern 103, that is, an upper surface of the impurity region 1_05 and the upper surface of the isolation pattern 112 may be exposed again.

Figure 12:
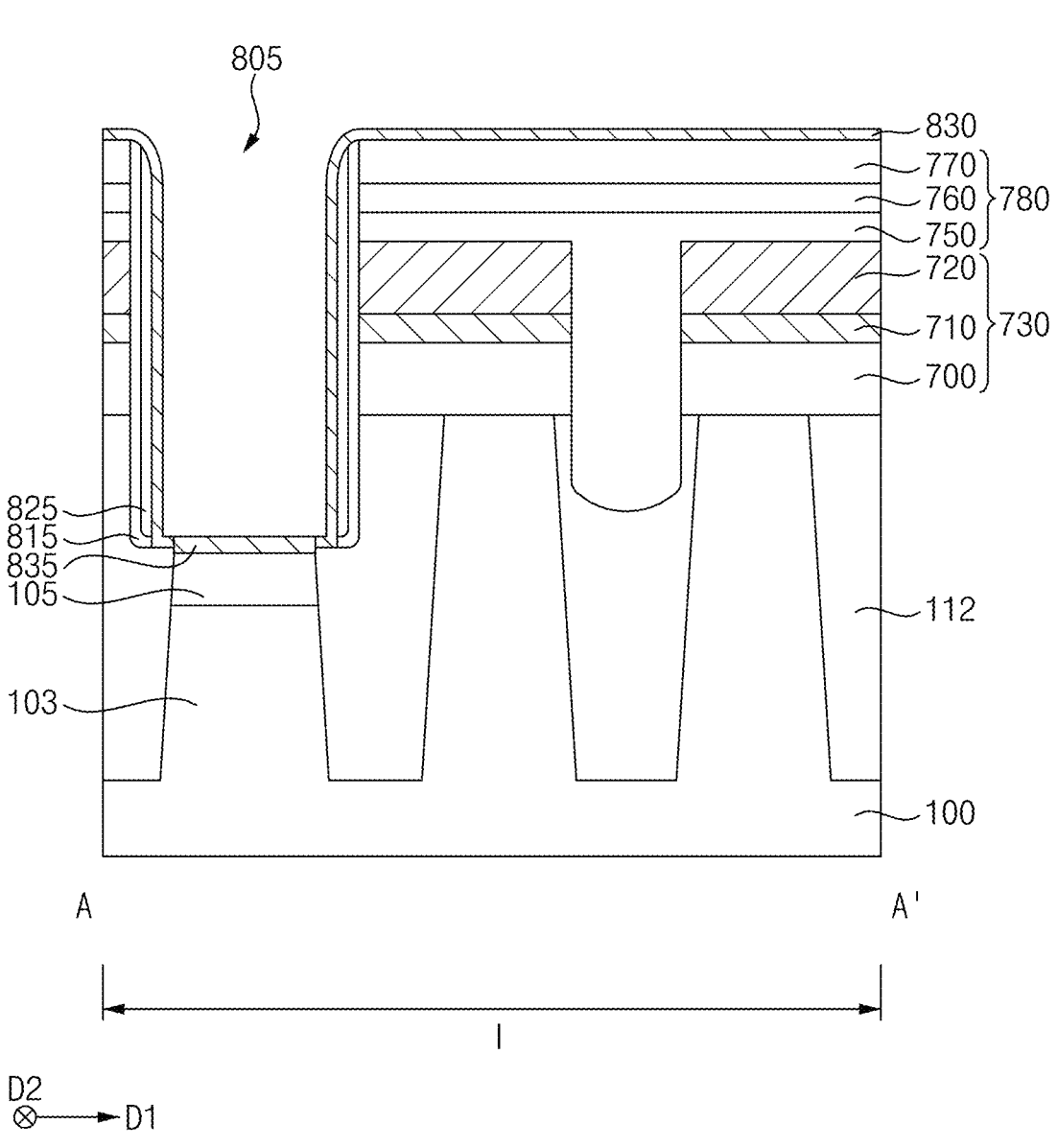

Referring to FIG. 12, a third conductive layer 830 including a metal may be formed on the exposed upper surfaces of the active pattern 103 and the isolation pattern 112, an inner sidewall and an upper surface of the lower spacer structure and an upper surface of the insulating pad layer structure 780, and a heat treatment process may be performed.

Thus, a portion of the first conductive layer 830 contacting the upper surface of the active: pattern 103 may be silicidated to form a first ohmic contact pattern 835.

Figure 13:
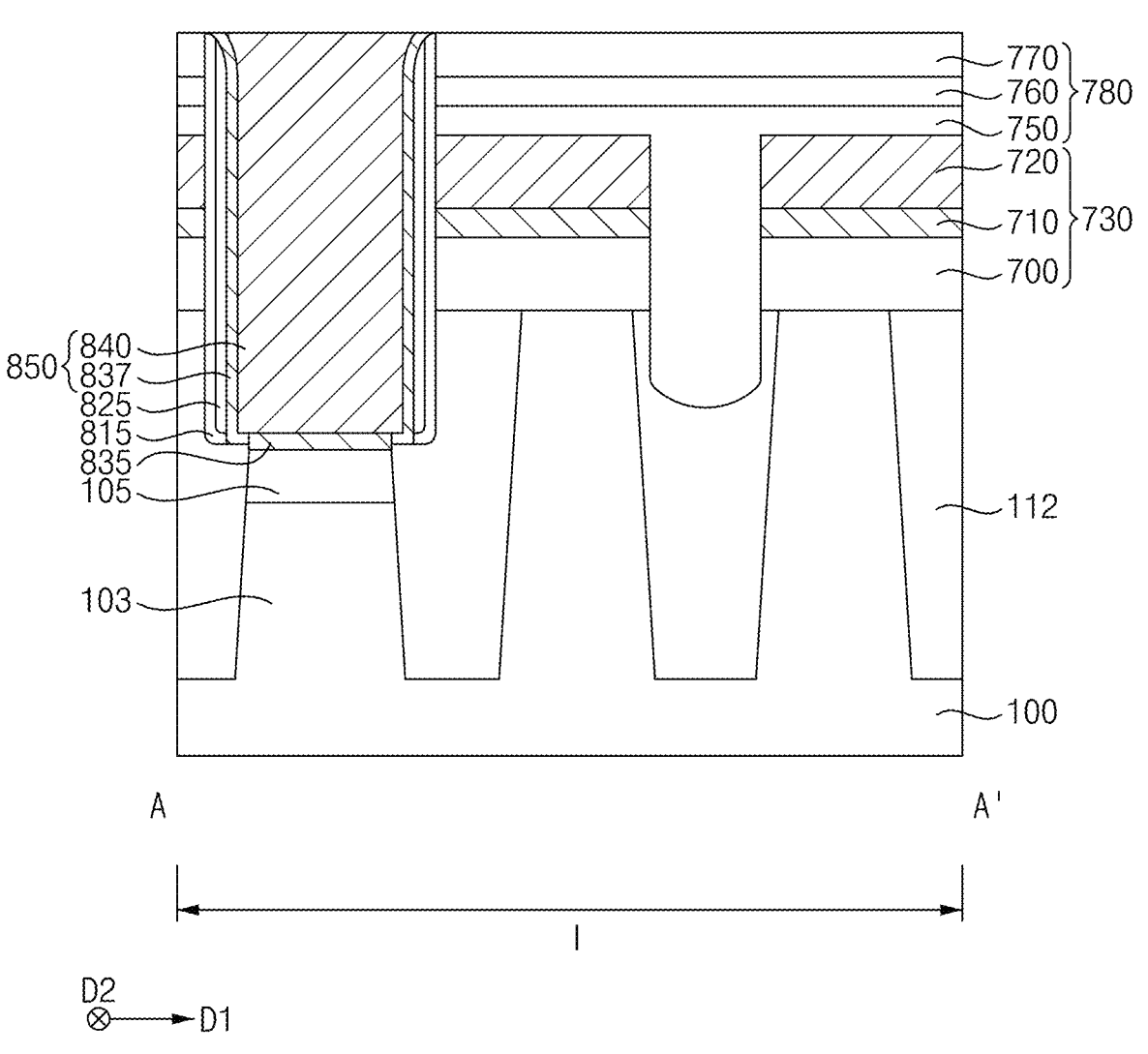

Referring to FIG. 13, a fourth conductive layer including a metal or a metal nitride may be formed on the third conductive layer 830 and the first ohmic contact pattern 835 to fill the second opening 805, and the fourth conductive layer and the third conductive layer 830 may be planarized until the upper surface of the insulating pad layer structure 780 is exposed.

The planarization process may include, e.g., a chemical mechanical polishing (CMP) process and/or an etch back process.

Thus, a fourth conductive pattern 840 and a third conductive pattern 837 covering a sidewall of the fourth conductive pattern 840 may be formed in the second opening 805, and a lower surface of the fourth conductive pattern 840 may contact an upper surface of the first ohmic contact pattern 835. The third and fourth conductive patterns 837 and 840 may form a conductive filling pattern 850.

Figure 14:
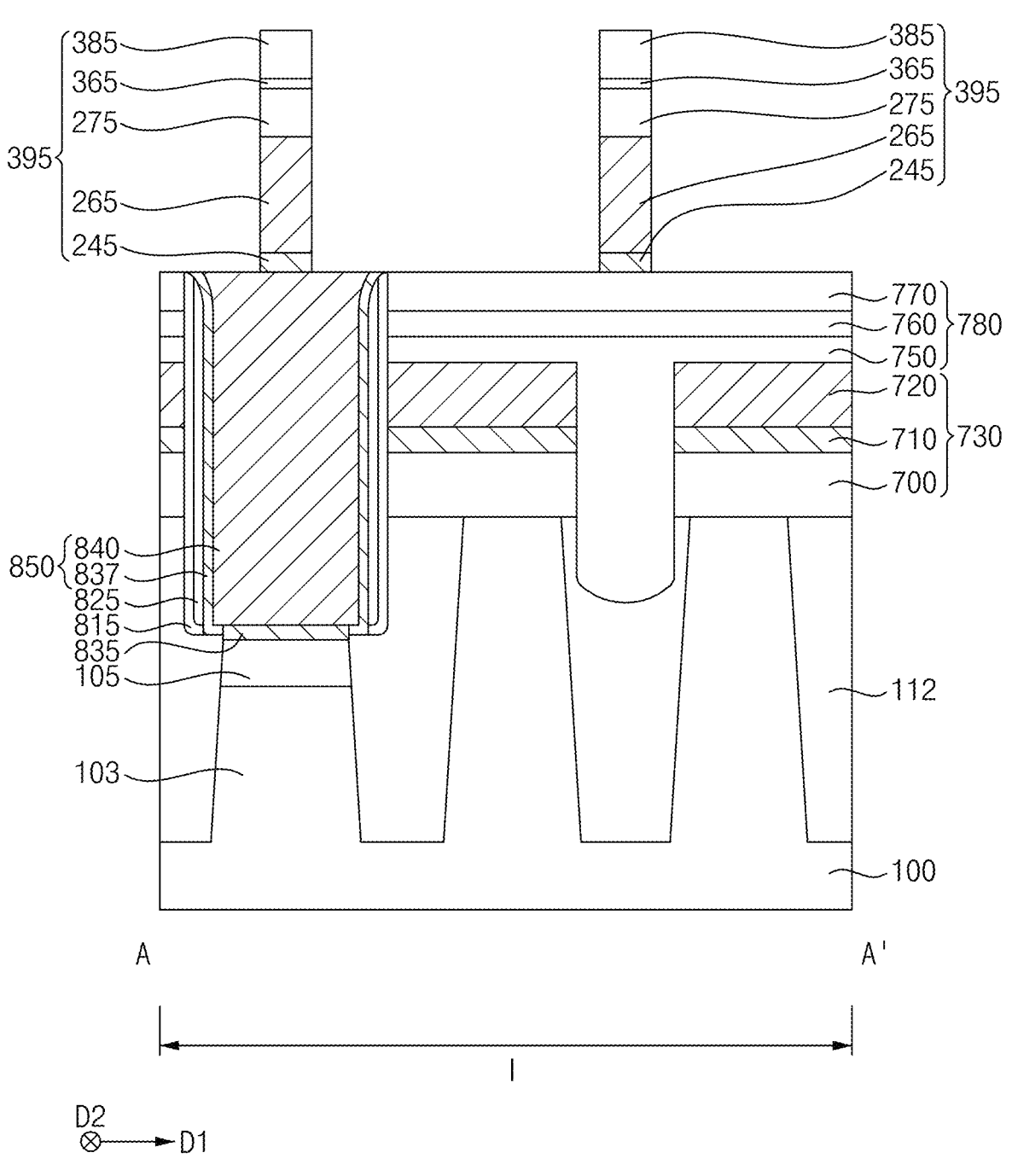

Referring to FIG. 14, an adhesion layer, a fifth conductive layer, a second mask layer, a first etch stop layer and a first capping layer may be sequentially formed on the insulating pad layer structure 780, the conductive filling pattern 850 and the lower spacer structure, the first capping layer may be patterned to form a first capping pattern 385, and the first etch stop layer, the second mask layer, the fifth conductive layer and the adhesion layer may be sequentially etched using the first capping pattern 385 as an etching mask.

By the etching process, an adhesion pattern 245, a fifth conductive pattern 265, a second mask 275, a first etch stop pattern 365 and the first capping pattern 385 sequentially stacked may be formed on the conductive filling pattern 850, the insulating pad layer structure 780 and the lower spacer structure.

The adhesion pattern 245 may be formed between the third insulation pad layer 770 including an insulating nitride, e.g., silicon nitride and the fifth conductive pattern 265 including a metal, e.g., tungsten, so that the third insulation pad layer 770 and the fifth conductive pattern 265 may be well attached to each other.

Hereinafter, the adhesion pattern 245, the fifth conductive pattern 265, the second mask 275, the first etch stop pattern 365 and the first capping pattern 385 sequentially stacked may be collectively referred to as a bit line structure 395. The bit line structure 395 may include a conductive structure having the adhesion pattern 245 and the fifth conductive pattern 265 and an insulation structure having the second mask 275, the first etch stop pattern 365 and the first capping pattern 385. In an example embodiment, the second mask 275, the first etch stop pattern 365 and the first capping pattern 385 sequentially stacked may be merged with each other to form a single insulation structure.

In example embodiments, the bit line structure 395 may extend in the second direction D2 on the substrate 100, and a plurality of bit line structures 395 may be spaced apart from each other in the first direction D1.

Figure 15:
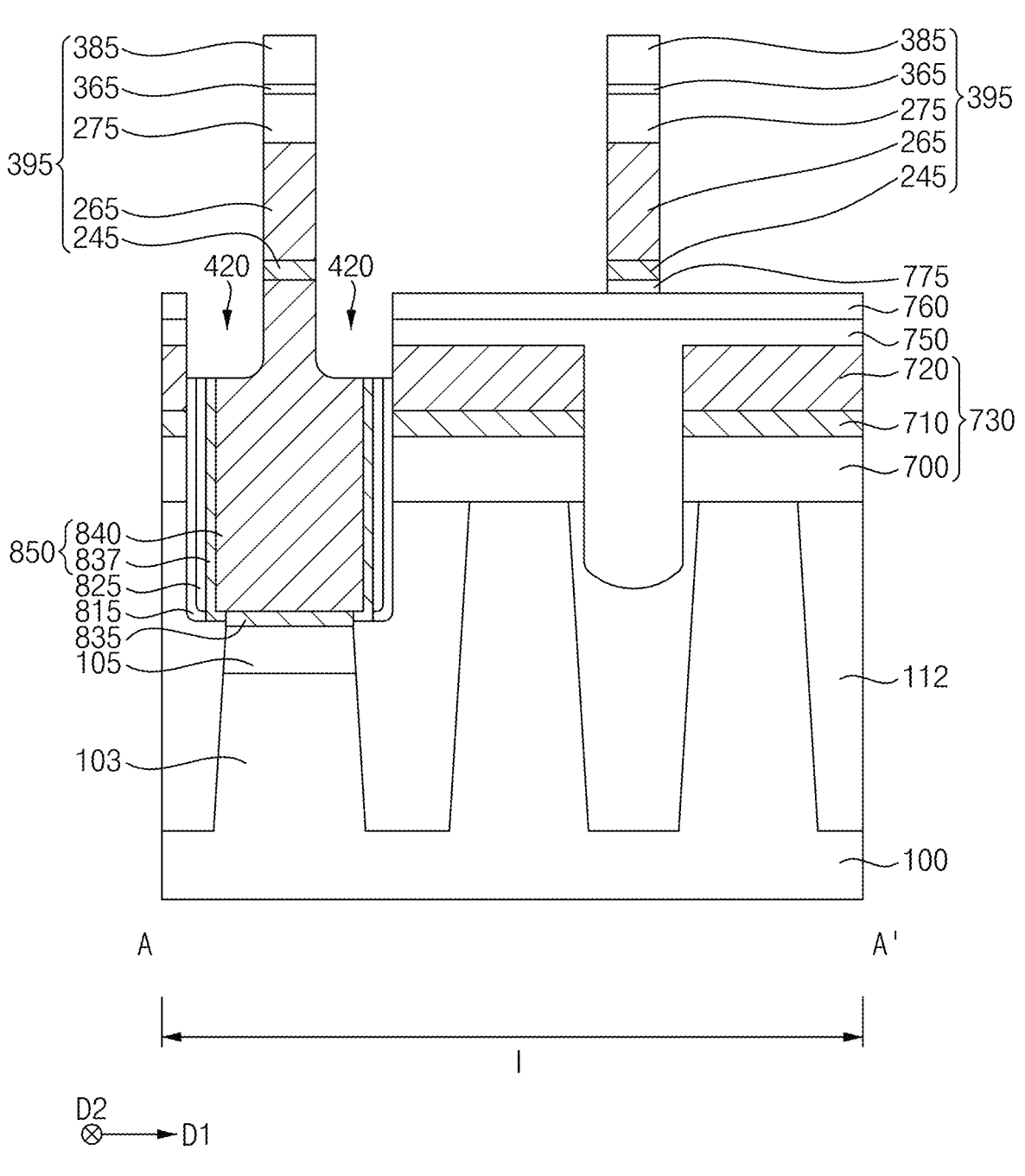

Referring to FIG. 15, upper portions of the conductive filling pattern 850 and the first and second lower spacers 815 and 8:25 not covered by the bit line structure 395 may be etched by an etching process, so that a third recess 420 may be formed.

By the etching process, the conductive filling pattern. 850 may have a lower portion having a relatively large width and an upper portion having a relatively small width. In an example embodiment, an upper surface of the lower portion of the conductive filling pattern 850 may be substantially coplanar with uppermost surfaces of the first and second lower spacers 815 and 825.

During the etching process, a portion of the third insulation pad layer 770 not covered by the bit line structure 395 may also be removed, and thus an upper surface of the second insulation pad layer 760 may be exposed. However, a portion of the third insulation pad layer 770 between the second insulation pad layer 760 and the bit line structure 395 may remain a third insulation pad 775.

Figure 16:
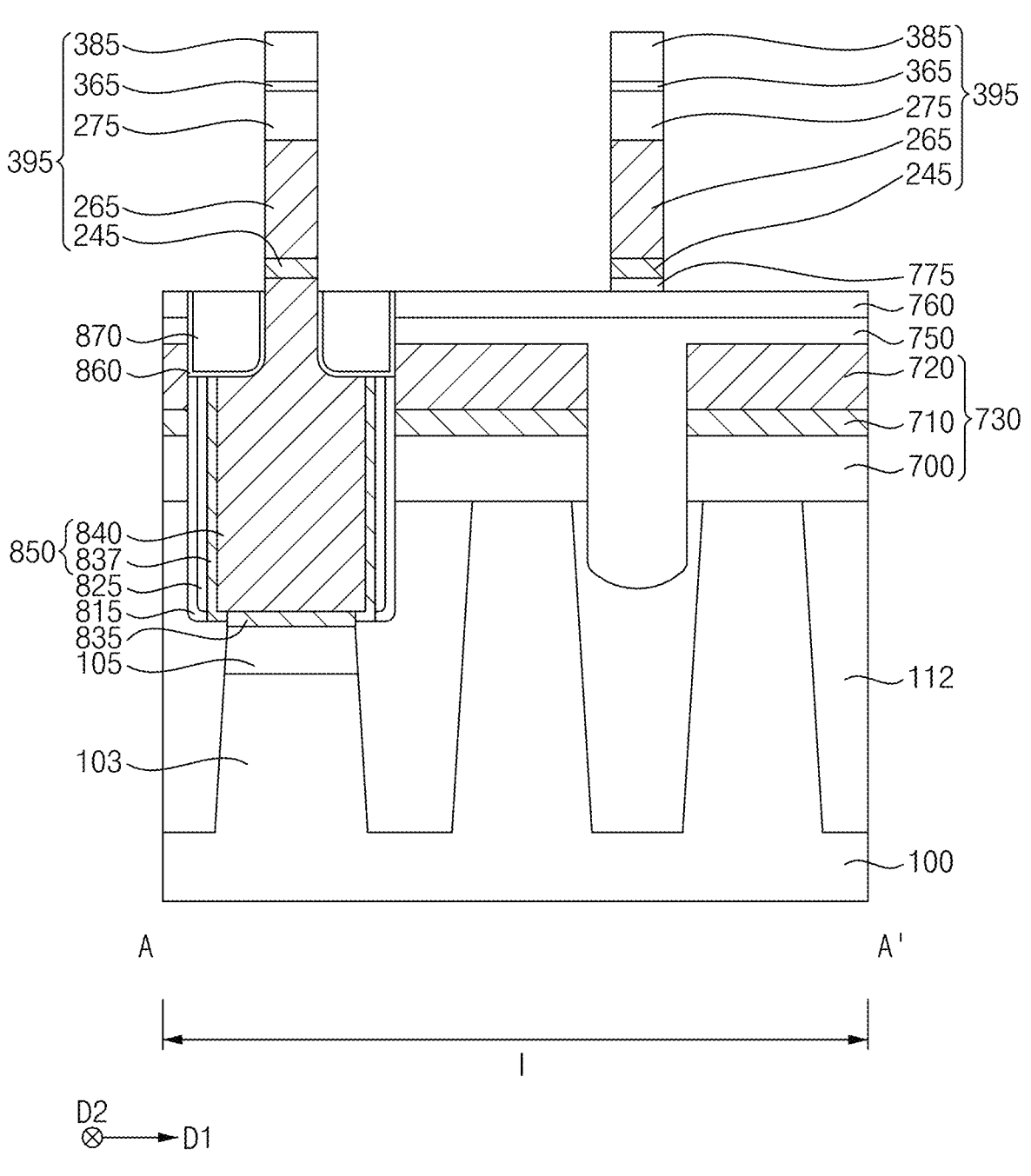

Referring to FIG. 16, a second capping layer may be formed on the bit line structure 395, the conductive filling pattern 850, the lower spacer structure, the first and second insulation pad layers 750 and 760 and the third insulation pad 775 by, e.g., an atomic layer deposition (ALD) process, an insulating filling layer may be formed on the second capping layer to fill the third recess 420, and the insulating filling layer may be removed by an etching process until the upper surface of the second insulation pad layer 760 is exposed.

During the etching process, a portion of the second capping layer at an outside of the third recess 420 may also be removed, and thus an upper surface and a sidewall of the bit line structure 395, the upper surface of the second insulation pad layer 760 and a sidewall of the third insulation pad 775 may be exposed.

Thus, a second capping pattern 860 may remain on an inner wall of the third recess 420, and an insulating filling pattern 870 may be formed on the second capping pattern 860. The lower spacer structure, the conductive and insulating filling patterns 850 and 870 and the second capping pattern 860 in the second opening 805 may collectively form a filling structure.

Figure 17:
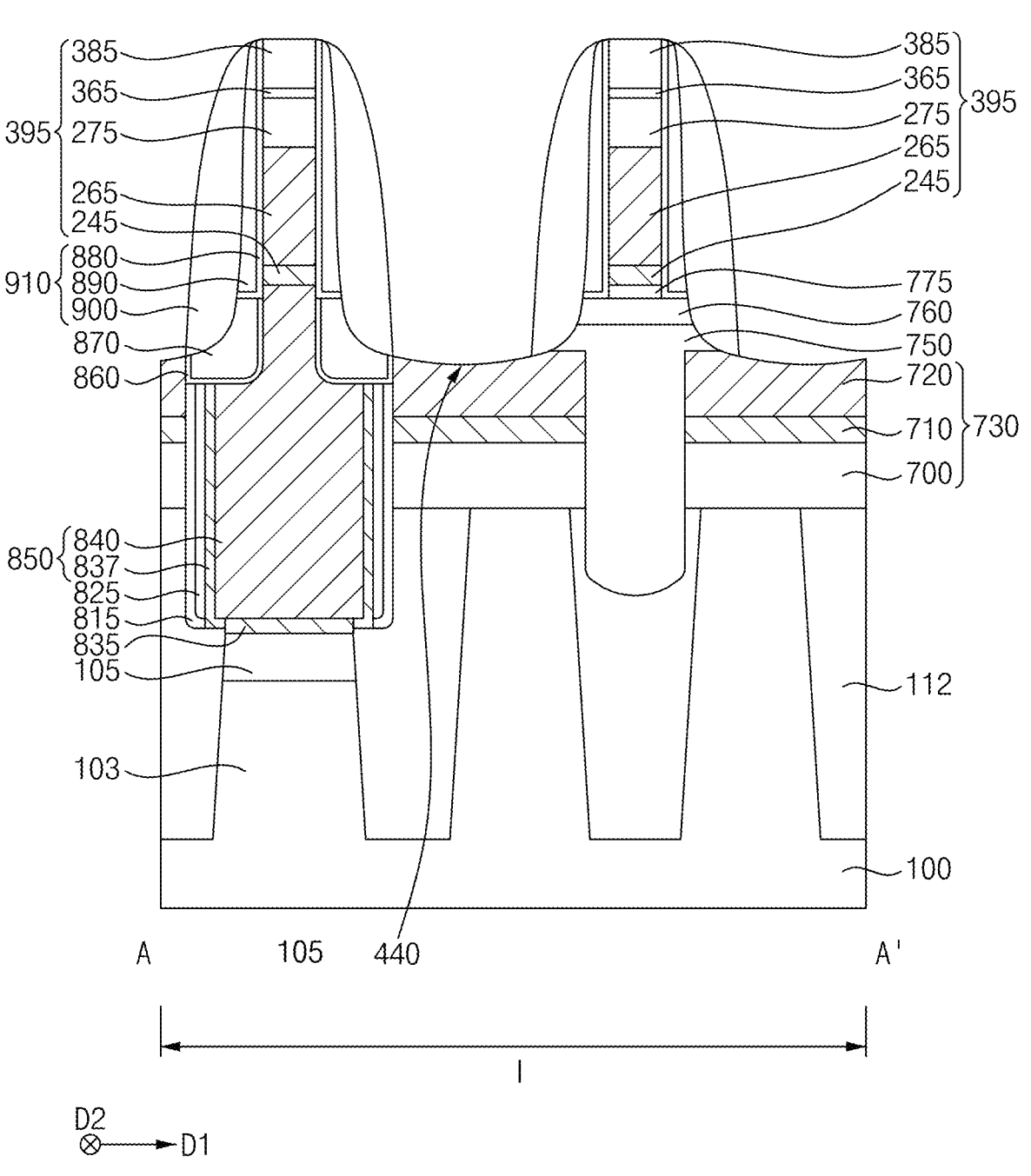

Referring to FIG. 17, first and second upper spacer layers may be sequentially formed on the substrate 100 having the bit line structure 395, the second insulation pad layer 760, the third insulation pad 775 and the filling structure thereon, and may be anisotropically etched to form a first upper spacer 880 covering the sidewall of the bit line structure 395 and upper surfaces of portions of the second capping pattern 860 and the insulating filling pattern 870 included in the filling structure, and a second upper spacer 890 on an outer sidewall of the first upper spacer 880.

A dry etching process may be performed using the bit line structure 395 and the first and second upper spacers 880 and 890 as an etching mask to form a third opening 440 partially extending through the second capping pattern 860, the insulating filling pattern 870, the second insulation pad layer 760 and the first insulation pad layer 750 to partially expose an upper surface of the third conductive pad 720.

A third upper spacer layer may be formed on upper surfaces of the first capping pattern 385 and the first upper spacer 880, an upper surface and an outer sidewall of the second upper spacer 890, an upper surface of a portion of the filling structure, and sidewalls of the first and second insulation pad layers 750 and 760 and the upper surface of the third conductive pad 720 exposed by the third opening 440, and may be anisotropically etched to form a third upper spacer 900 covering the outer sidewall of the second upper spacer 890. The third upper spacer 900 may also cover the upper surface of the portion of the filling structure.

The first to third upper spacers 880, 890 and 900 sequentially stacked on the sidewall of the bit line structure 395 may collectively form a preliminary upper spacer structure 910.

Figure 18:
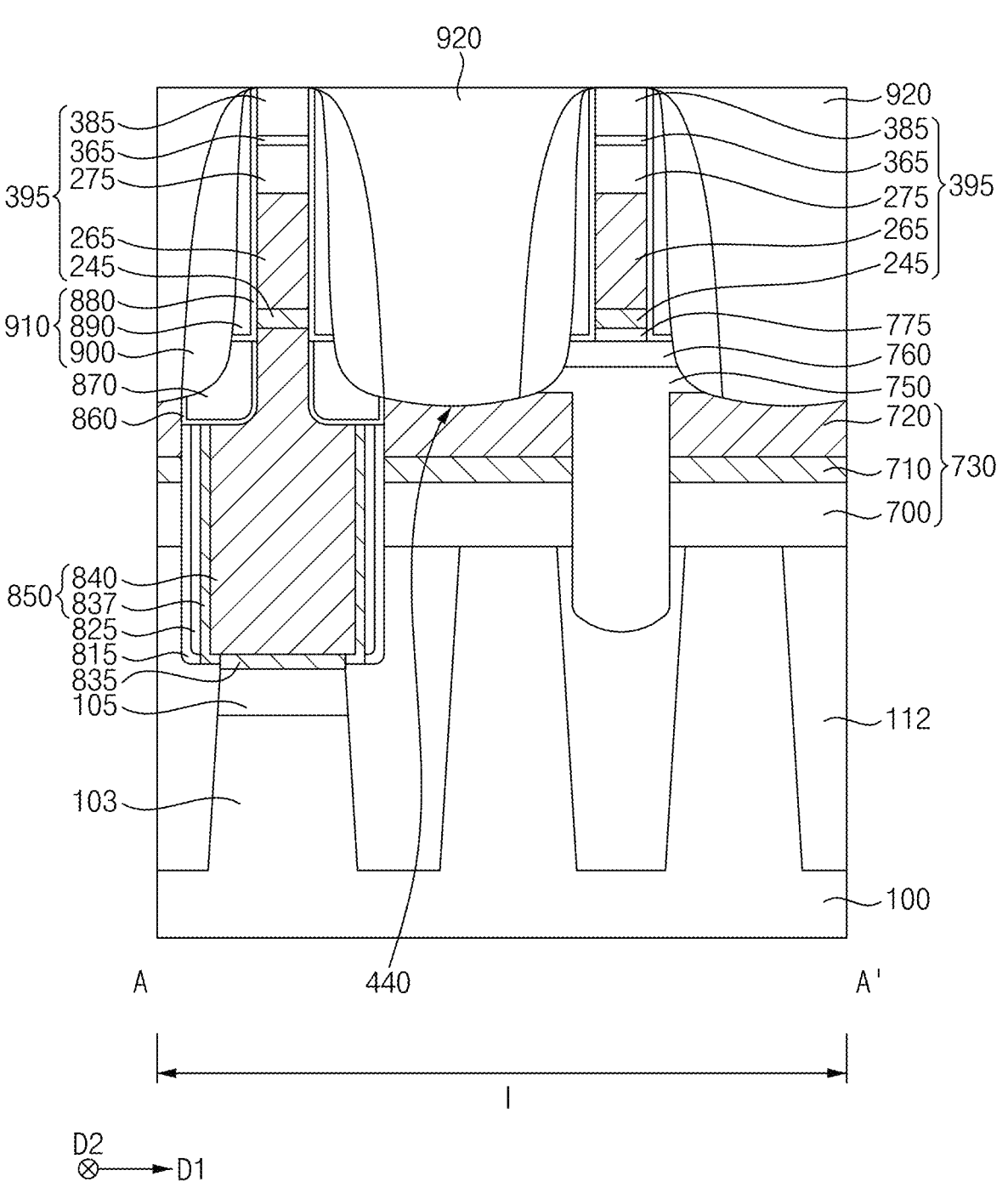

Referring to FIG. 18, a first sacrificial layer may be formed on the substrate 100 to fill the third opening 440, and may be planarized until the upper surface of the first capping pattern 385 is exposed to form a first sacrificial pattern 920. In example embodiments, the first sacrificial pattern 920 may extend in the second direction D2, and a plurality of first sacrificial patterns 920 may be spaced apart from each other in the first direction D1 by the bit line structure 395. The first sacrificial pattern 920 may include an oxide, e.g., silicon oxide.

Figure 19:
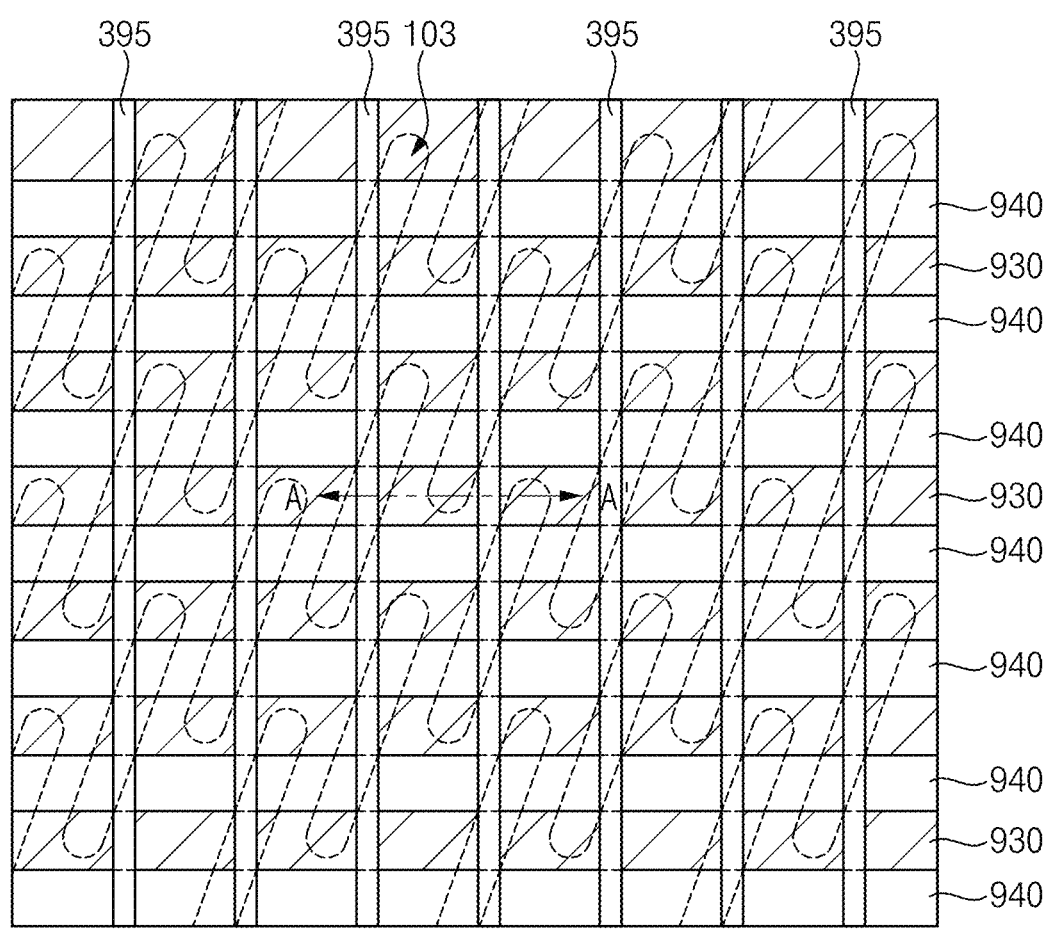
Figure 19:
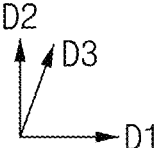
Figure 20:
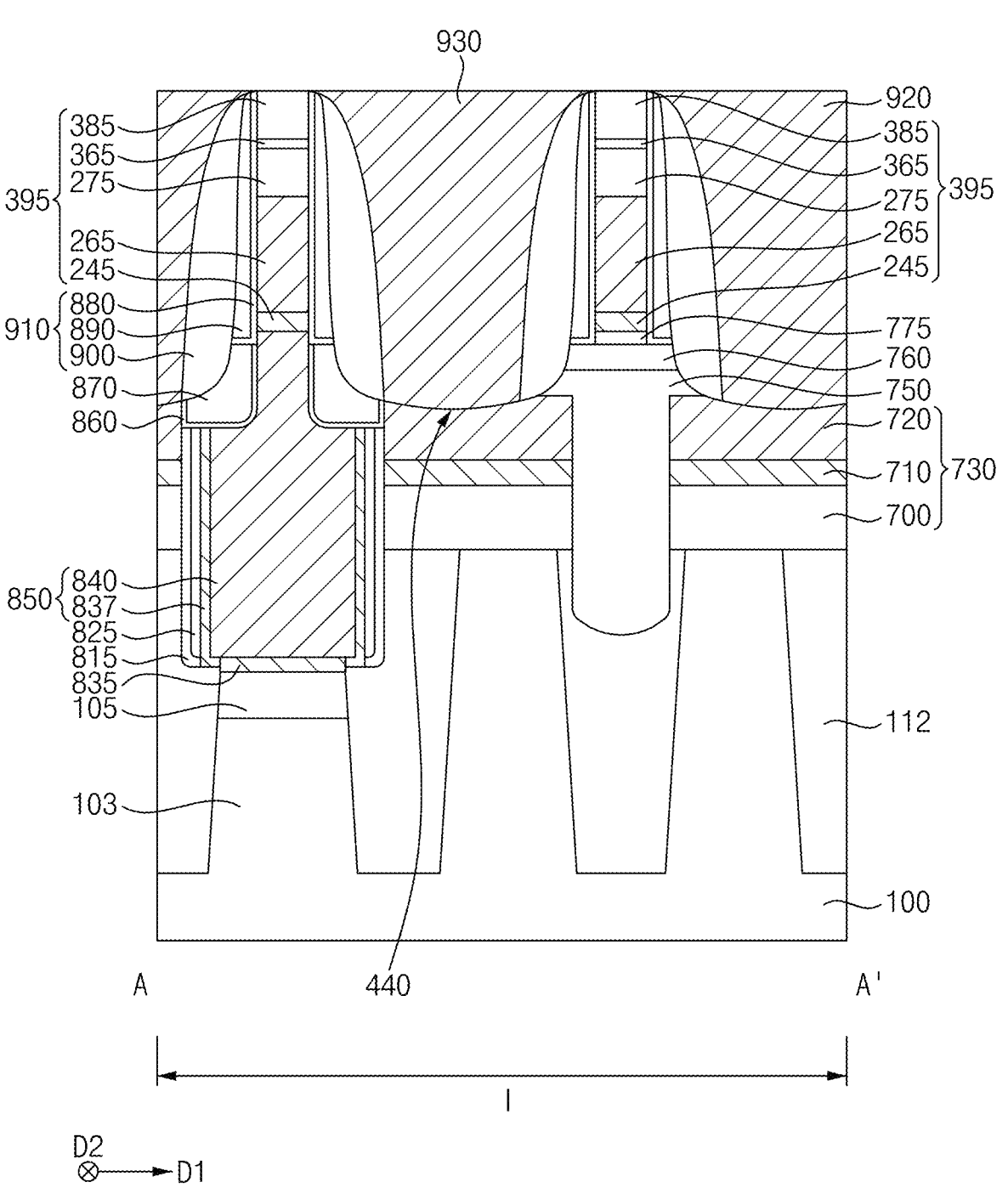

Referring to FIGS. 19 and 20, a third mask including a plurality of fourth openings, each of which may extend in the first direction D1, spaced apart from each other in the second direction D2 may be formed on the first capping pattern 385, the first sacrificial pattern 920 and the preliminary upper spacer structure 910, and the first sacrificial pattern 920 may be etched using the third mask as an etching mask to form a fifth opening exposing an upper surface of the gate mask 160 of the gate structure 170.

In example embodiments, each of the fifth openings may overlap the gate structure 170 in the vertical direction, and a plurality of fifth openings may be spaced apart from each other in the second direction D2 between neighboring ones of the bit line structure 395 in the first direction D1.

After removing the third mask, a third capping pattern 940 may be formed to fill each of the fifth openings. According to the layout of the fifth openings, a plurality of third capping patterns 940 may be spaced apart from each other in the second direction D2 between neighboring ones of the bit line structures 395 in the first direction D1. The third capping pattern 940 may include an insulating nitride, e.g., silicon nitride.

The first sacrificial pattern 920 may be divided into a plurality of parts spaced apart from each other in the second direction D2 between the bit line structures 395.

The first sacrificial patterns 920 may be removed to form sixth openings each of which may partially expose the upper surface of the conductive pad structure. A plurality of sixth openings may be spaced apart from each other in the second direction D2 between the bit line structures 395.

A lower contact plug layer may be formed to fill the sixth openings, and may be planarized until upper surfaces of the first and third capping patterns 385 and 940 and the preliminary upper spacer structure 910 are exposed. Thus, the lower contact plug layer may be divided into a plurality of lower contact plugs 930 spaced apart from each other by the third capping patterns 940 between the bit line structures 395.

The lower contact plug 930 may include, e.g., doped polysilicon, and may contact the third conductive pad 720 to be electrically connected to the active pattern 103.

Figure 21:
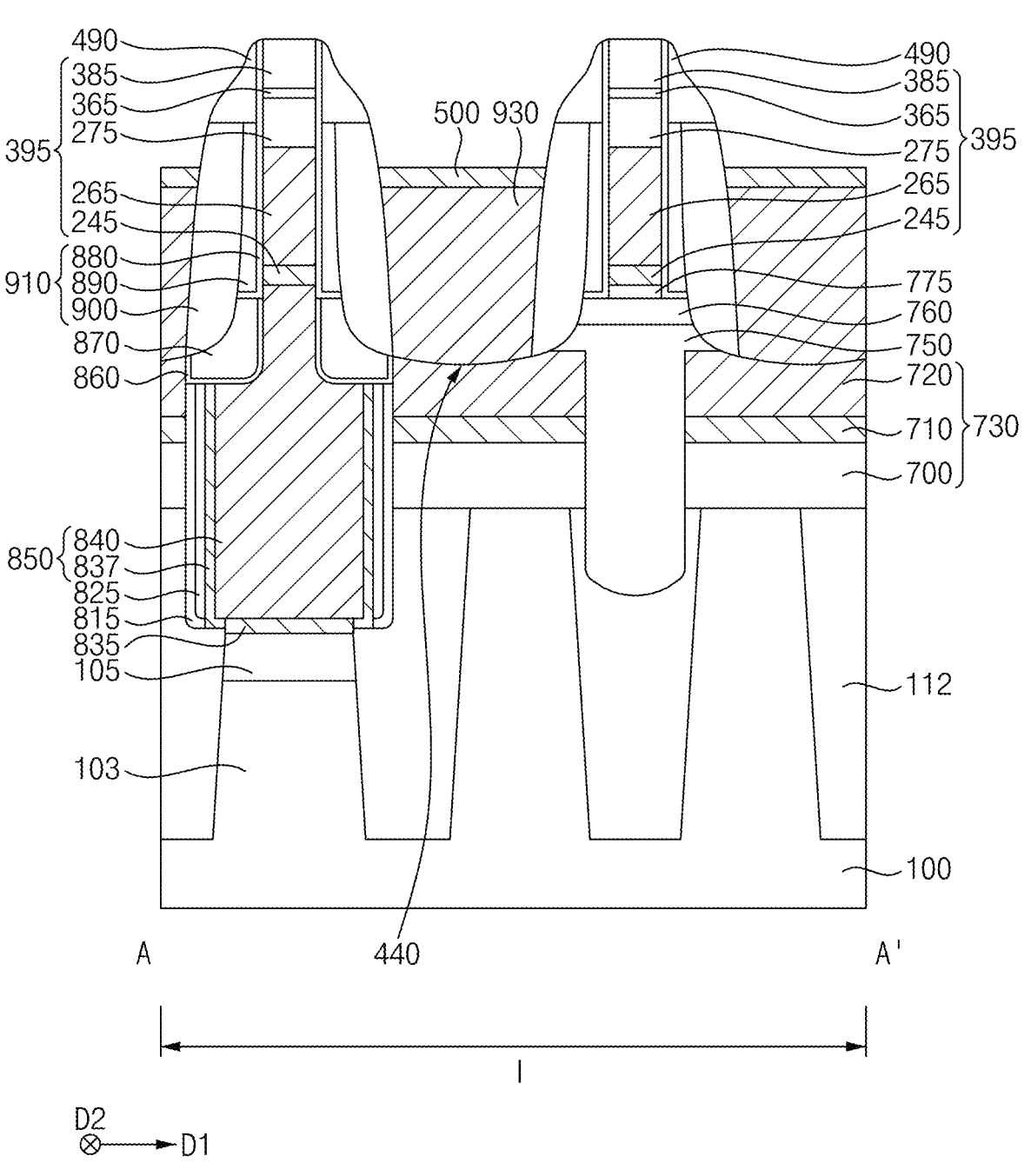

Referring to FIG. 21, an upper portion of the lower contact plug 930 may be removed to expose an upper portion of the preliminary upper spacer structure 910 on the sidewall of the bit line structure 395, and upper portions of the second and third spacers 890 and 900 of the preliminary upper spacer structure 910 may be removed.

The upper portion of the lower contact plug 930 may be removed by, e.g., an etch back process, and the upper portions of the second and third spacers 890 and 900 may be removed by, e.g., a wet etching process.

A fourth upper spacer layer may be formed on the bit line structure 395, the preliminary spacer structure 910, the lower contact plug 930 and the third capping pattern 940, and may be anisotropically etched to form a fourth upper spacer 490 on an outer sidewall of a portion of the first upper spacer 880 on the upper sidewall of the bit line structure 395.

The fourth upper spacer 490 may cover an upper surface of the second upper spacer 890 and an upper surface of at least a portion of the third upper spacer 900. Thus, during the anisotropic etching process, an upper portion of the lower contact plug 930 may be partially removed, and a portion of the third upper spacer 900 not covered by the fourth upper spacer 490 may also be removed.

In an example embodiment, a fifth upper spacer layer may be formed on the bit line structure 395, the first upper spacer 880, the fourth upper spacer 490, the lower contact plug 930 and the third capping pattern 940, the fifth upper spacer layer may be anisotropically etched to form a fifth upper spacer on a sidewall of the fourth upper spacer 490, and an etching process may be performed using the bit line structure 395, the first upper spacer 880, the fourth upper spacer 490, the lower contact plug 930, the third capping pattern 940 and the fifth upper spacer as an etching mask to further remove an upper portion of the lower contact plug 930. Thus, an upper surface of the lower contact plug 930 may be lower than uppermost surfaces of the second and third upper spacers 890 and 900.

A second ohmic contact pattern 500 may be formed on the upper surface of the lower contact plug 930. In example embodiments, the second ohmic contact pattern 500 may be formed by forming a sixth conductive layer including a metal on the bit line structure 395, the first upper spacer 880, the fourth upper spacer 490, the lower contact plug 930 and the third capping pattern 940, and performing a heat treatment on the sixth conductive layer, that is, by performing a silicidation process in which the sixth conductive layer including the metal and the lower contact plug 930 including silicon are reacted with each other, and removing an unreacted portion of the sixth conductive layer.

Figure 22:
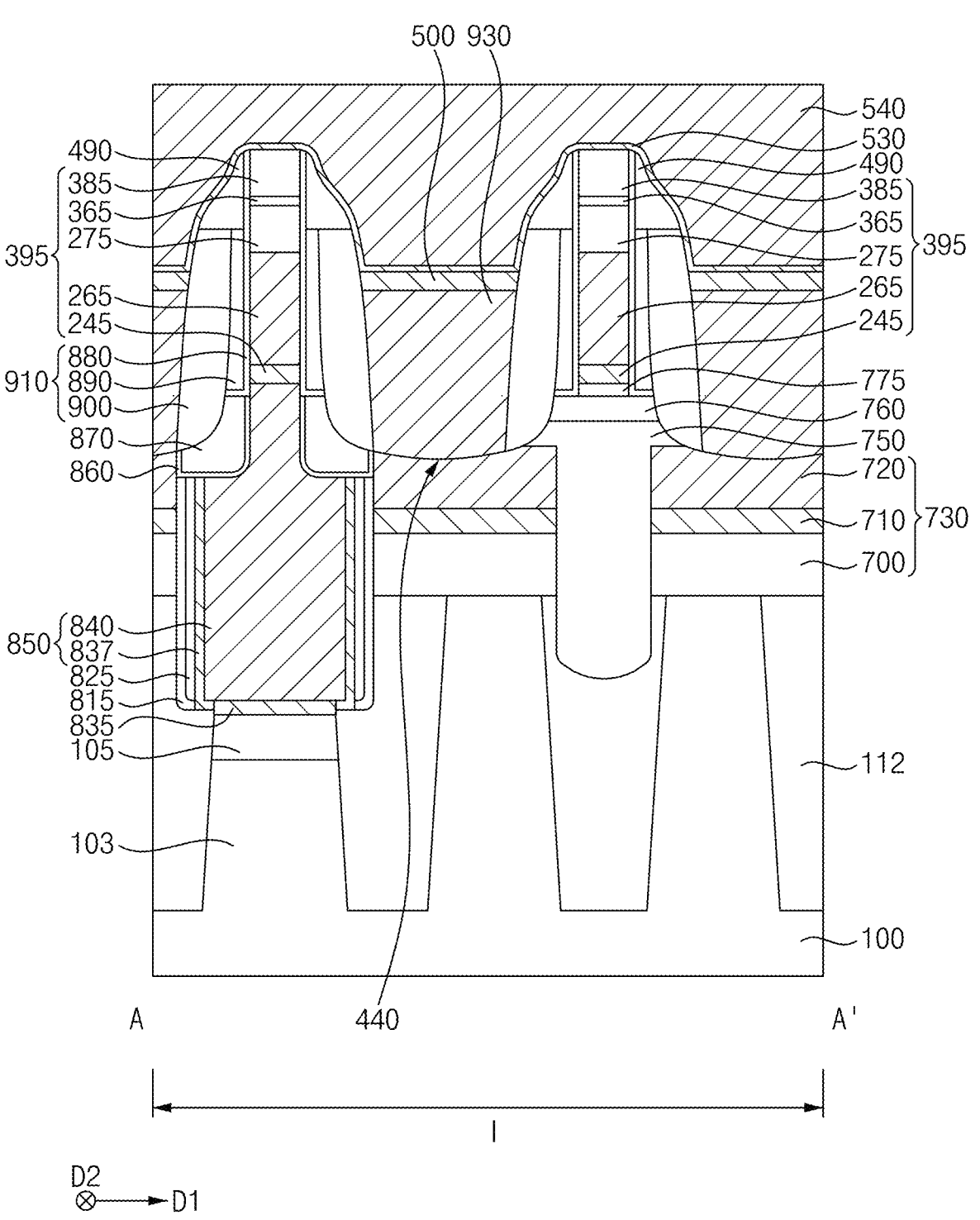

Referring to FIG. 22, a second barrier layer 530 may be formed on the bit line structure 395, the first upper spacer 880, the fourth upper spacer 490, the second ohmic contact pattern 500 and the third capping pattern 940, and a seventh conductive layer 540 may be formed on the second barrier layer 530 to fill a space between the bit line structures 395.

A planarization process may be performed on an upper portion of the seventh conductive layer 550. The planarization process may include a CMP process and/or an etch back process.

Referring to FIGS. 23 and 24, the seventh conductive layer 540 and the second barrier layer 530 may be patterned to form an upper contact plug 549, and a seventh opening 547 may be formed between a plurality of upper contact plugs 549.

During the formation of the seventh opening 547, not only the seventh conductive layer 540 and the second barrier layer 530 but also an upper portion of the insulation structure included in the bit line structure 395, the preliminary upper spacer structure 910 and the fourth upper spacer 490 on the sidewall thereof, and the third capping pattern 940 may also be partially removed, and thus an upper surface of the second upper spacer 890 may be exposed.

As the seventh opening 547 is formed, the seventh conductive layer 540 and the second barrier layer 530 may be transformed, respectively, into a seventh conductive pattern 545 and a second barrier pattern 535 covering a lower surface and a sidewall of the seventh conductive pattern 545, which may form the upper contact plug 549. In example embodiments, the plurality of upper contact plugs 549 may be spaced apart from each other in the first and second directions D1 and D2, and may be arranged in a honeycomb pattern or a lattice pattern in a plan view. Each of the upper contact plugs 549 may have a shape of a circle, an ellipse, or a polygon in a plan view.

The lower contact plug 930, the second ohmic contact pattern 500 and the upper contact plug 549 sequentially stacked on the substrate 100 may collectively form a contact plug structure.

The second upper spacer 890 may be removed to form an air gap 895 connected to the seventh opening 547. The second upper spacer 890 may be removed by, e.g., a wet etching process.

In example embodiments, not only a first portion of the second upper spacer 890 on the sidewall of the bit line structure 395 extending in the second direction D2, which are directly exposed by the seventh opening 547, but also a second portion of the second upper spacer 890 that is parallel to the first portion in the horizontal direction may be removed. That is, not only the portion of the second upper spacer 890 exposed by the seventh opening 547 not to be covered by the upper contact plug 549 but also a portion of the second upper spacer 890 covered by the upper contact plug 549 may be removed.

Referring to FIGS. 1 and 2 again, a first insulation pattern 615 may be formed on an inner wall of the seventh opening 547, and a second insulation pattern 620 may be formed on the first insulation pattern 615 to fill a remaining portion of the seventh opening 547. Thus, a top end of the air gap 895 may be closed.

The air gap 895 may also be referred to as an air spacer 895, and the first upper spacer 880, the air spacer 895 and the third upper spacer 900 may collectively form an upper spacer structure 915.

The first and second insulation patterns 615 and 620 may form an insulation pattern structure.

A second etch stop layer 630 may be formed on the first and second insulation patterns 615 and 620, the upper contact plug 549 and the third capping pattern 940, and a mold layer may be formed on the second etch stop layer 630. A portion of the mold layer and a portion of the second etch stop layer 630 thereunder may be removed to form an eighth opening exposing an upper surface of the upper contact plug 549.

As the upper contact plugs 549 are arranged in a honeycomb pattern or a lattice pattern in a plan view, the eighth openings exposing the upper contact plugs 549, respectively, may also be arranged in the honeycomb pattern or the lattice pattern in a plan view.

A lower electrode layer may be formed on the upper surface of the upper contact plug 549 exposed by the eighth opening, a sidewall of the eighth opening and an upper surface of the mold layer, a second sacrificial layer may be formed on the lower electrode layer to fill a remaining portion of the eighth opening, and the second sacrificial layer and the lower electrode layer may be planarized until the upper surface of the mold layer is exposed so that the lower electrode layer may be divided into a plurality of pieces.

Accordingly, a lower electrode 640 may be formed to have a shape of a cylinder in the eighth opening. However, if the eighth opening has a small width, the lower electrode 640 may have a shape of a pillar.

The second sacrificial layer and the mold layer may be removed by a wet etching process using, e.g., LAL solution as an etching solution.

A dielectric layer 650 may be formed on a surface of the lower electrode 640 and an upper surface of the fourth etch stop layer 630. The dielectric layer 650 may include, e.g., a metal oxide.

An upper electrode 660 may be formed on the dielectric layer 650. The upper electrode 660 may include, e.g., a metal, a metal nitride, a metal silicide, doped silicon-germanium. In an example embodiment, the upper electrode 660 may include a first upper electrode containing a metal or a metal nitride and a second upper electrode containing doped silicon-germanium.

The lower electrode 640, the dielectric layer 650 and the upper electrode 660 may collectively form a capacitor 670.

Upper wirings may be further formed on the capacitor 670, so that the fabrication of the semiconductor device may be completed.

As illustrated above, after forming the first lower spacer layer 810 including an insulating material containing impurities to contact the upper surface of the active pattern 103 exposed by the second opening 805, a heat treatment process may be performed on the first lower spacer layer 810, so that the impurities included in the first lower spacer layer 810 may diffuse into the upper portion of the active pattern 103 to form the impurity region 105. Accordingly, the impurity region 105 at the upper portion of the active pattern 103 may include impurities having a high concentration.

For example, if a gas phase doping (GPD) process is performed on the upper portion of the active pattern 103 exposed by the second opening 805 to form an impurity region, due to the characteristics of the GPD process, the impurity region may not include impurities having a high concentration. Particularly, as the second opening 805 is formed, a natural oxide layer may be formed on the upper surface of the active pattern 103, and when the GPD process is performed with the natural oxide layer on the upper surface of the active pattern 103, the impurity region may not have a high concentration of impurities, and thus a cleaning process for removing the natural oxide layer is needed before the GPD process.

Additionally, in order to limit and/or prevent impurities from leaking outside during the GPD process, a capping layer has to be formed on the upper surface of the active pattern 103, and thus, for example, a stripping process for removing the capping layer has to be performed after the GPD process and the heat treatment process.

During the cleaning process for removing the natural oxide layer or the stripping process for removing the capping layer, a portion of the isolation pattern 112 adjacent to the active pattern 103 and including, e.g., silicon oxide may also be removed, which may cause leakage current or electric short.

However, in example embodiments, instead of forming the impurity region through the GPD process, the impurity region 105 may be formed by forming the first lower spacer layer 810 including impurities and performing a heat treatment process thereon, so as to diffuse the impurities included in the first lower spacer layer 810 into the upper portion of the active pattern 103.

Thus, when compared to forming the impurity region through the GPD process, the impurity region 105 may have a high impurity concentration, and the damage of the portion of the isolation pattern 112 adjacent to the active pattern 103 may be limited and/or prevented so that the leakage current and electric short may be reduced or prevented.

Figure 25:
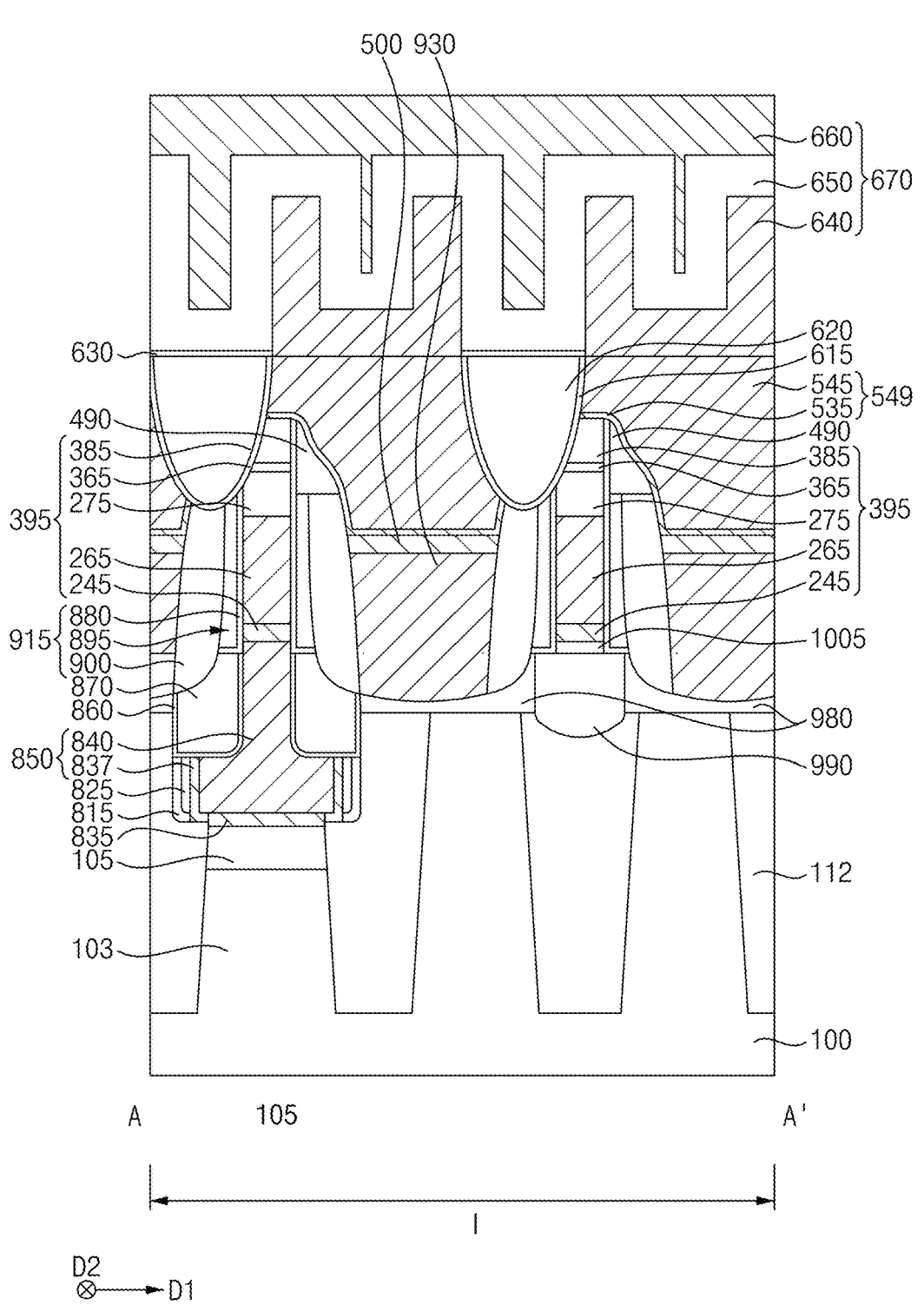
FIG. 25 is a cross-sectional view illustrating a semiconductor device in accordance with example embodiments.

FIG. 25 is a cross-sectional view illustrating a semiconductor device in accordance with example embodiments, which may correspond to FIG. 2.

This semiconductor device may be substantially the same as or similar to that of FIGS. 1 and 2, except for some elements, and thus repeated explanations are omitted herein.

Referring to FIG. 25, a fourth conductive pad 980 and a fourth insulation pad 990 may be formed on the active pattern 103, the isolation pattern 112 and the gate structure 170.

Figure 26:
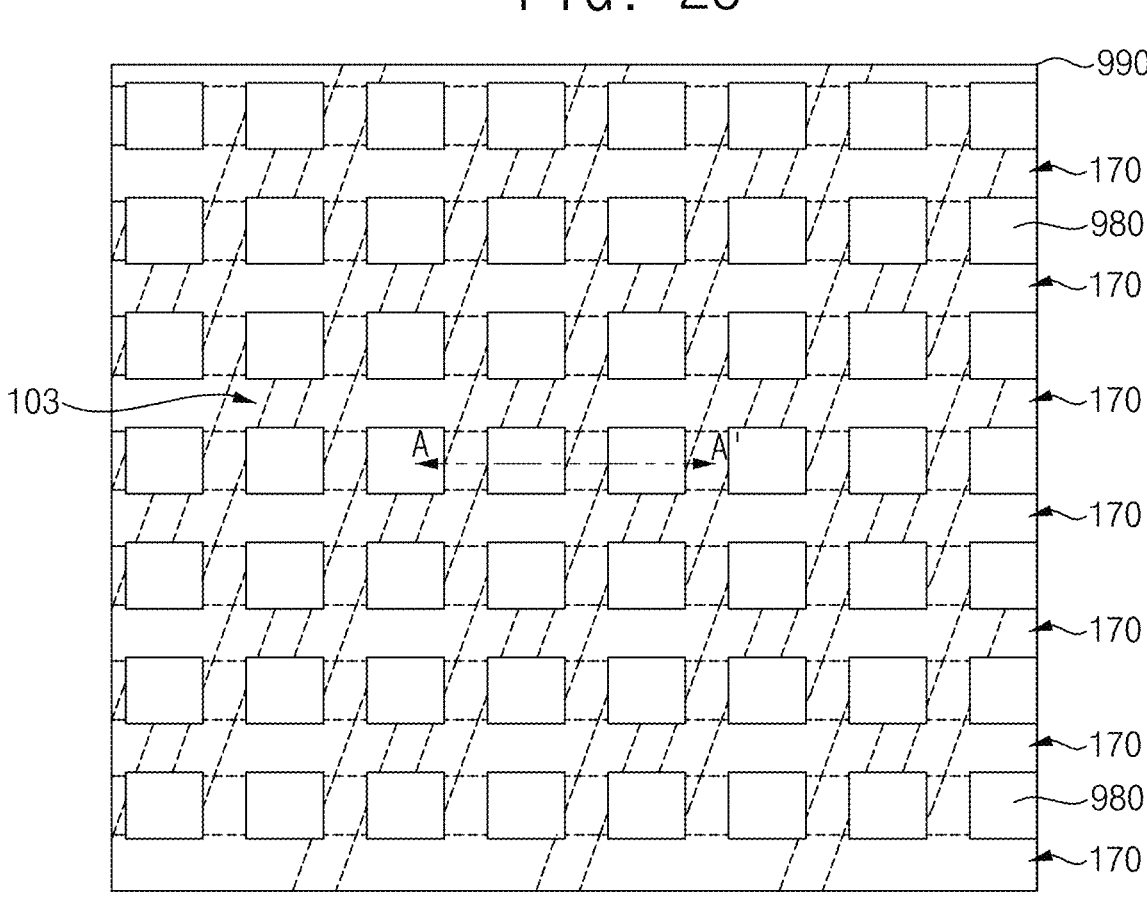
FIGS. 26 to 30 are plan views and cross-sectional views illustrating a method of manufacturing a semiconductor device in accordance with example embodiments.
Figure 26:
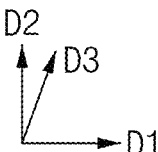
Figure 27:
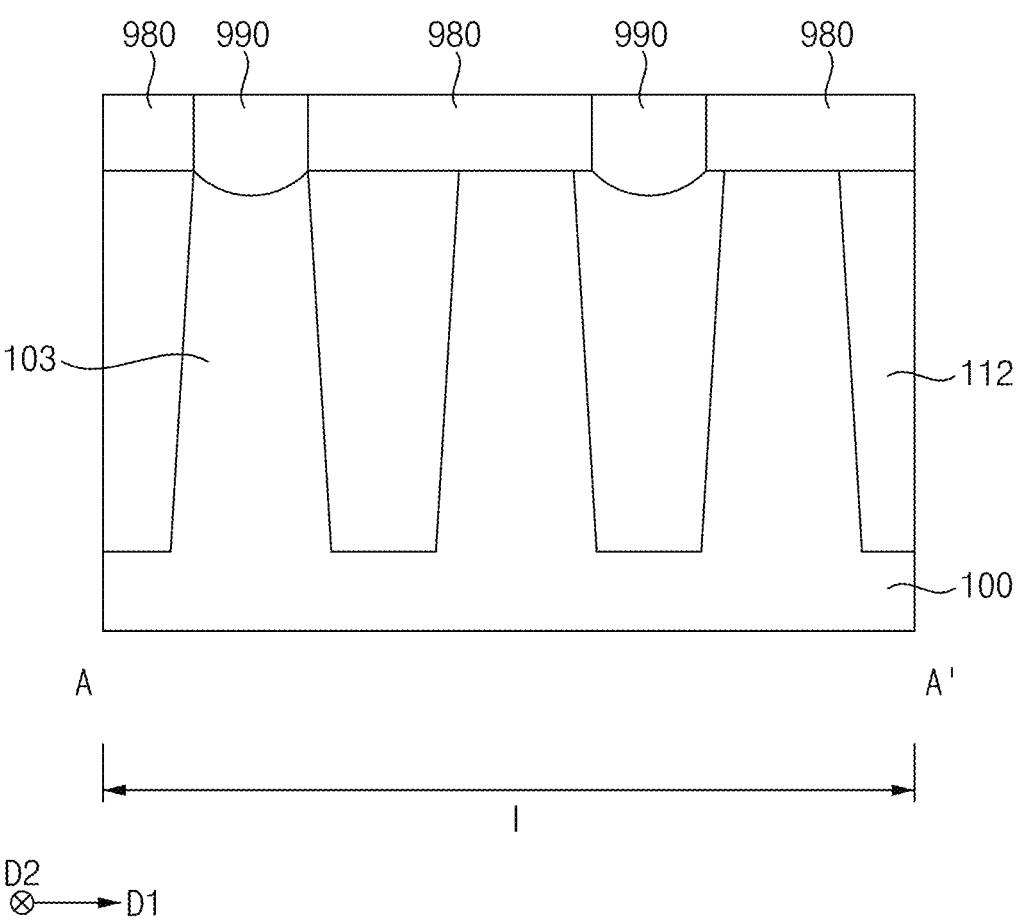

Referring to FIG. 25 together with FIGS. 26 and 27, in example embodiments, a plurality of fourth conductive pads 980 may be spaced apart from each other in the first and second directions D1 and D2, and may be arranged in a lattice pattern. The fourth insulation pad 990 may include a first extension portion extending in the first direction D1 and a second extension portion extending in the second direction D2, which may be connected with each other. Thus, each of the fourth conductive pads 980 may be surrounded by the fourth insulation pad 990.

In example embodiments, the fourth conductive pad 980 may overlap in the vertical direction an end portion in the third direction D3 of each of the active patterns 103 and a portion of the isolation pattern 112 adjacent thereto in the first direction D1.

The fourth conductive pad 980 may include, e.g., doped polysilicon, a metal such as tung, ruthenium, etc., a metal nitride such as titanium nitride, tantalum nitride, etc., or a conductive material such as graphene. In an example embodiment, the fourth conductive pad 980 may be a single layer including one of the above materials. Alternatively, the fourth conductive pad 980 may be a multi-layered structure including ones of the above materials, respectively. FIG. 27 shows that the fourth conductive pad 980 is a single layer. The fourth insulation pad 990 may include an insulating nitride, e.g., silicon nitride.

The filling structure may be formed in the second opening 805 (refer to FIGS. 28 and 9) extending through the fourth conductive pad 980, the fourth insulation pad 990, an upper portion of the active pattern 103, an upper portion of the isolation pattern 112 and an upper portion of the gate structure 170, and may include the conductive filling pattern 850, the lower spacer structure, the second capping pattern 860 and the insulating filling pattern 870, as shown in FIGS. 1 and 2.

The bit line structure 395 may be formed on the filling structure, and a fifth insulation pad 1005 may be formed between a portion of the bit line structure 395 at an outside of the second opening 805 and the fourth insulation pad 990. The fifth insulation pad 1005 may include an insulating nitride, e.g., silicon nitride.

Figure 28:
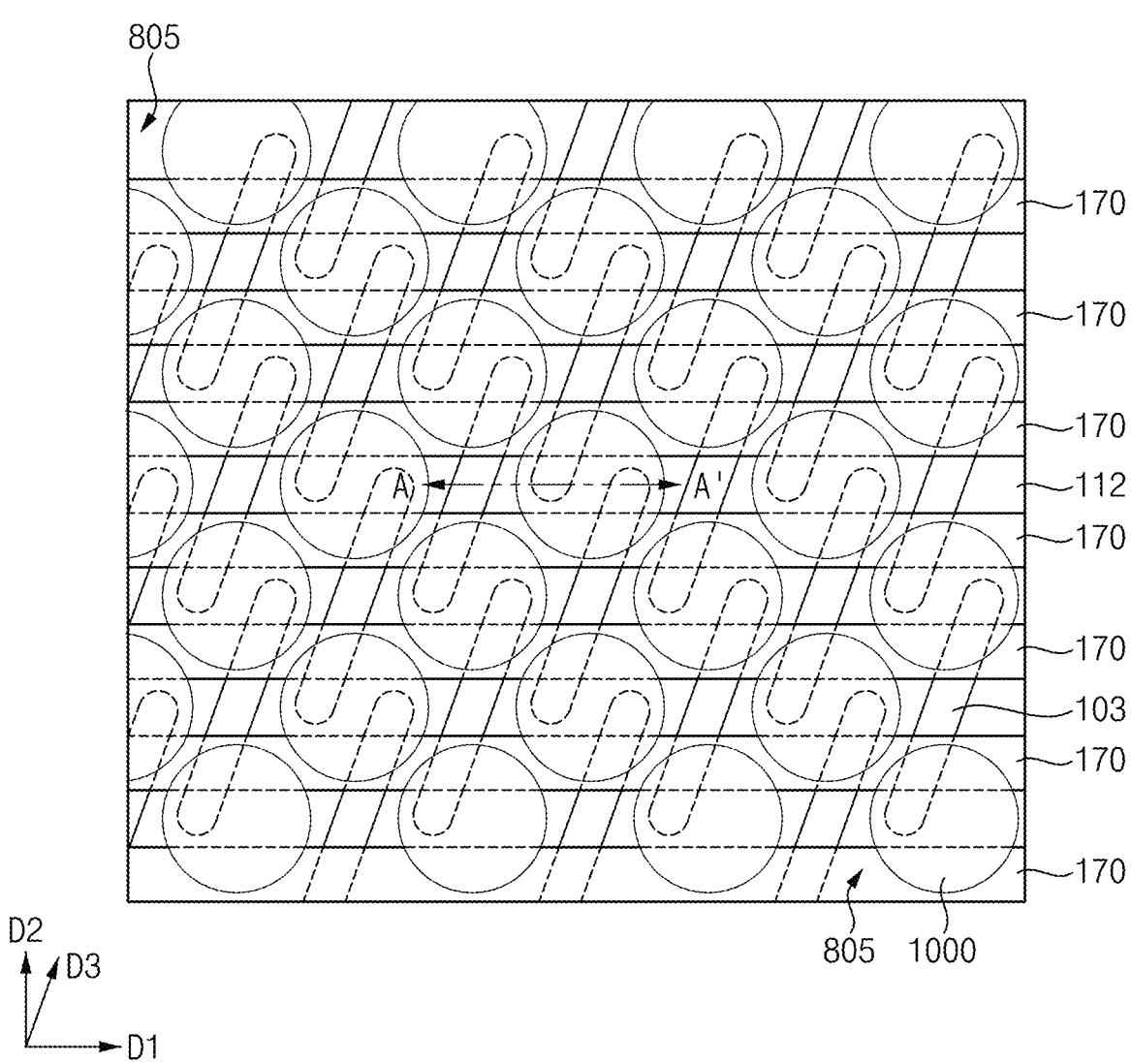
Figure 29:
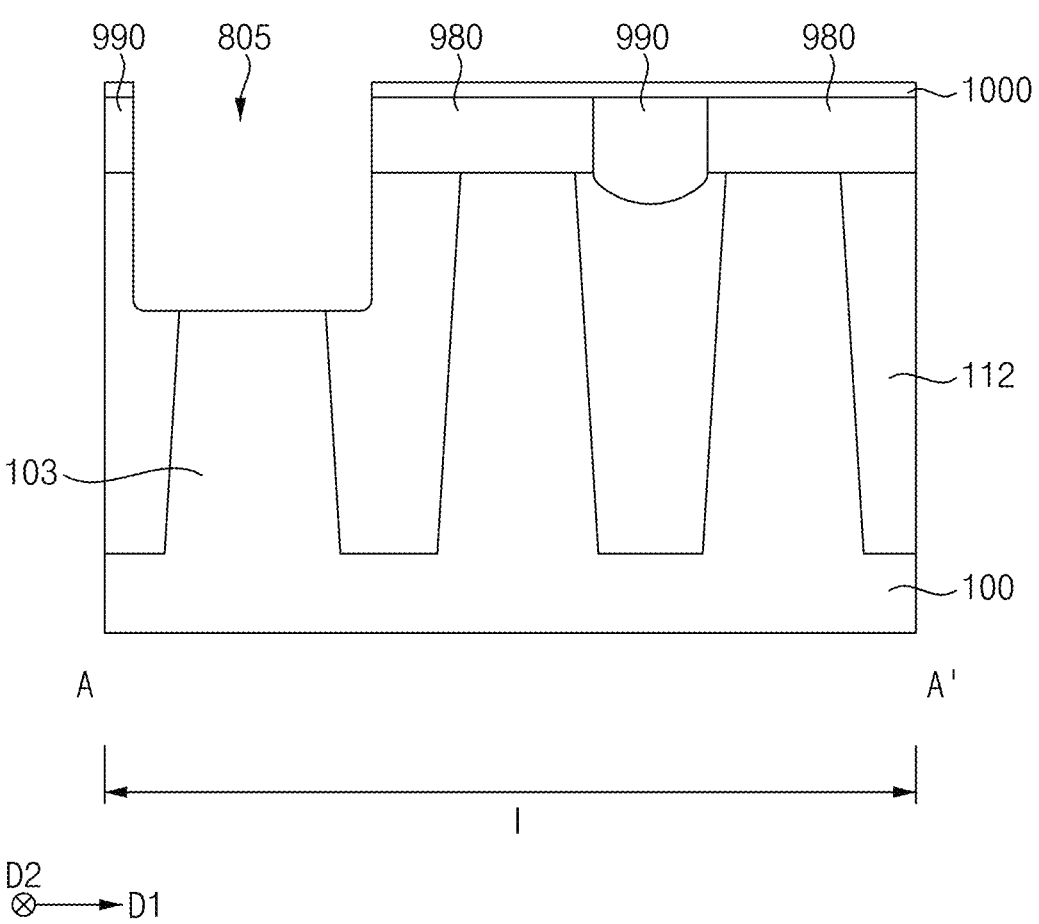
Figure 30:
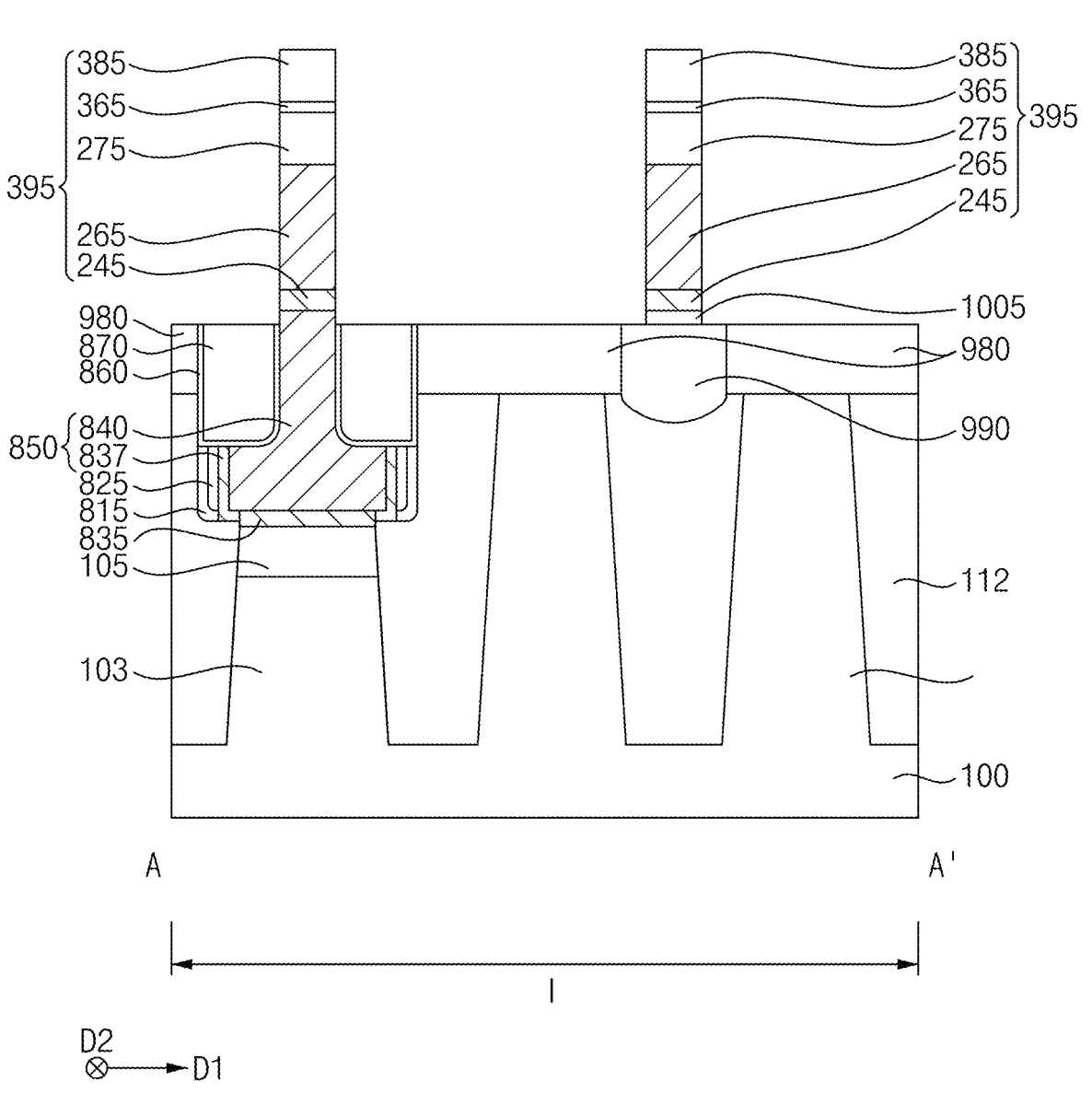

FIGS. 26 to 30 are plan views and cross-sectional views illustrating a method of manufacturing a semiconductor device in accordance with example embodiments. Particularly, FIGS. 29 and 31 are plan views, and FIGS. 27, 29 and 30 are cross-sectional views taken along lines A-A' of corresponding plan views, respectively.

This method may include processes substantially the same as or similar to those illustrated with reference to FIGS. 1 to 24, and thus repeated explanations are omitted herein.

Referring to FIGS. 26 and 27, processes substantially the same as or similar to those illustrated with reference to FIGS. 3 and 4 may be performed, and a fourth conductive pad 980 and a fourth insulation pad 990 may be formed on the substrate 100 having the active pattern 103, the isolation pattern 112 and the gate structure 170.

In example embodiments, a fourth conductive pad layer may be formed on the substrate 100, the fourth conductive pad layer may be patterned to form the fourth conductive pad 980 and a ninth opening partially exposing upper surfaces of the active pattern 103, the isolation pattern 112 and the gate structure 170, and the fourth insulation pad 990 may be formed to fill the ninth opening. Alternatively, a fourth insulation pad layer may be formed on the substrate 100, the fourth insulation pad layer may be patterned to form the fourth insulation pad 990, and the fourth conductive pad 980 may be formed.

In example embodiments, the ninth opening may include a first portion extending in the first direction D1 and a second portion extending in the second direction D2, which may be connected with each other. Thus, the fourth insulation pad 990 that may be formed in the ninth opening may include a first extension portion extending in the first direction D1 and a second extension portion extending in the second direction D2, which may be connected with each other. A plurality of fourth conductive pads 980 may be spaced apart from each other in the first and second directions D1 and D2, and may be arranged in a lattice pattern in a plan view.

In example embodiments, the fourth conductive pad 980 may overlap in the vertical direction an end portion in the third direction D3 of each of the active patterns 103 and a portion of the isolation pattern 112 adjacent thereto in the first direction D1.

Referring to FIGS. 28 and 29, a fifth insulation pad layer 1000 may be formed on the fourth conductive pad 980 and the fourth insulation pad 990, the fifth insulation pad layer 1000 may be patterned, and processes substantially the same as or similar to those illustrated with reference to FIGS. 7 and 8 may be performed.

Particularly, the fourth conductive pad 980, the fourth insulation pad 990, the active pattern 103, the isolation pattern 112 and the gate mask 160 may be partially etched using the fifth insulation pad layer 1000 as an etching mask to form the second opening 805.

In example embodiments, the fifth insulation pad layer 1000 may have a shape of a circle or an ellipse in a plan view, and a plurality of fifth insulation pad layers 1000 may be spaced apart from each other in the first and second directions D1 and D2. Each of the fifth insulation pad layers 1000 may overlap in the vertical direction end portions of the active patterns 103 adjacent to each other in the first direction D1 and a portion of the isolation pattern 112 therebetween.

Referring to FIG. 30, processes substantially the same as or similar to those illustrated with reference to FIGS. 9 to 13 may be performed.

Thus, the impurity region 105 may be formed at the upper portion of the active pattern 103 exposed by the second opening 805, the first ohmic contact pattern 835 may be formed on the impurity region 105, and the filling structure including the conductive filling pattern 850, the lower spacer structure, the second capping pattern 860 and the insulating filling pattern 870 may be formed in the second opening 805.

The bit line structure 395 may be formed on the filling structure, and the fifth insulation pad layer 1000 may be patterned to form a fifth insulation pad 1005 between the portion of the bit line structure 395 at the outside of the second opening 805 and the fourth insulation pad 990.

Referring to FIG. 25 again, processes substantially the same as or similar to those illustrated with reference to FIGS. 14 to 24 and FIGS. 1 and 2 may be performed to complete the fabrication of the semiconductor device.

The lower contact plug 930 may be formed to contact the fourth conductive pad 980.

While example embodiments have been particularly shown and described, it will be understood by one of ordinary skill in the art that variations in form and detail may be made therein without departing from the spirit and scope of the claims.

What is claimed is:

1. A semiconductor device comprising:
   a substrate including an active pattern, the active pattern including an impurity region at an upper portion of the active pattern, the impurity region including impurities;
   a conductive filling pattern on the impurity region;
   a first spacer and a second spacer stacked on a sidewall of the conductive filling pattern in a horizontal direction, the horizontal direction being parallel to an upper surface of the substrate; and
   a bit line structure on the conductive filling pattern,
   wherein the first spacer includes an insulating material containing the impurities.

2. The semiconductor device according to claim 1, wherein
   the impurity region includes silicon doped with phosphorous, and
   the first spacer includes phosphorous silicate glass (PSG).

3. The semiconductor device according to claim 1, wherein the second spacer includes a low-k dielectric material or silicon nitride.

4. The semiconductor device according to claim 1, further comprising:
   an ohmic contact pattern, wherein
   the conductive filling pattern includes a metal,
   the ohmic contact pattern is between the impurity region and the conductive filling pattern, and
   the ohmic contact pattern includes a metal silicide.

5. The semiconductor device according to claim 4, wherein
   the conductive filling pattern includes a first conductive pattern and a second conductive pattern, the second conductive pattern includes a metal or a metal nitride,
   the first conductive pattern covers a sidewall of the second conductive pattern, and
   the first conductive pattern includes a metal.

6. The semiconductor device according to claim 5, wherein the ohmic contact pattern includes a silicide of the metal included in the first conductive pattern.

7. The semiconductor device according to claim 1, wherein
   the impurity region is in an upper portion of a central portion of the active pattern, and
   an upper surface of the impurity region is lower than upper surfaces of opposite end portions of the active pattern.

8. The semiconductor device according to claim 7, further comprising:
   an isolation pattern on a sidewall of the active pattern;
   a conductive pad structure on the active pattern and the isolation pattern, wherein
   the conductive pad structure overlaps at least a portion of the conductive filling pattern in a horizontal direction, and
   the horizontal direction is parallel to the upper surface of the substrate.

9. The semiconductor device according to claim 8, further comprising:
   a contact plug structure on the conductive pad structure; and
   a capacitor on the contact plug structure, wherein
   the conductive pad structure contacts the opposite end portions of the active pattern.

10. The semiconductor device according to claim 1, wherein
    the conductive filling pattern includes a lower portion and an upper portion contacting each other, and
    a width of the lower portion of the conductive filling pattern is greater than a width of the upper portion of the conductive filling pattern.

11. A semiconductor device comprising:
    a substrate including an active pattern protruding in a vertical direction from an upper surface of the substrate, the vertical direction being perpendicular to the upper surface of the substrate;
    an isolation pattern covering a sidewall of the active pattern;
    a conductive filling pattern on the active pattern, an impurity region at a portion of the active pattern being under the conductive filling pattern, the conductive filling pattern including a metal, the impurity region including n-type impurities;
    a spacer structure on a sidewall of the conductive filling pattern, the spacer structure including an insulating material containing the n-type impurities; and
    a bit line structure on the conductive filling pattern.

12. The semiconductor device according to claim 11, wherein
    the spacer structure includes phosphorous silicate glass (PSG), and
    the impurity region includes silicon doped with phosphorous.

13. The semiconductor device according to claim 11, wherein
    the spacer structure includes a first spacer and a second spacer,
    the first spacer is on an outer sidewall of the second spacer, the first spacer includes the n-type impurities, and the second spacer covers the sidewall of the conductive filling pattern.

14. The semiconductor device according to claim 13, wherein the second spacer includes a low-k dielectric material or silicon nitride.

15. The semiconductor device according to claim 11, further comprising:

an ohmic contact pattern between the impurity region and the conductive filling pattern, wherein the ohmic contact pattern includes a metal silicide.

16. The semiconductor device according to claim 15, wherein the conductive filling pattern includes a first conductive pattern and a second conductive pattern, the first conductive pattern covers a sidewall of the second conductive pattern, the first conductive pattern includes a metal, and the second conductive pattern includes a metal or a metal nitride.

17. The semiconductor device according to claim 16, wherein the ohmic contact pattern includes a silicide of the metal included in the first conductive pattern.

18. A semiconductor device comprising:

a substrate including an active pattern protruding in a vertical direction from an upper surface of a substrate, the vertical direction being perpendicular to the upper surface of the substrate;

an isolation pattern covering a sidewall of the active pattern;

an ohmic contact pattern on a central portion of the active pattern, an impurity region at a portion of the active pattern being under the ohmic contact pattern, the impurity region including n-type impurities;

a conductive filling pattern on the ohmic contact pattern;

a spacer structure on a sidewall of the conductive filling pattern;

a bit line structure on the conductive filling pattern;

a conductive pad structure on each of opposite end portions of the active pattern, the conductive pad structure overlapping at least a portion of the conductive filling pattern in a horizontal direction, the horizontal direction being parallel to the upper surface of the substrate;

a contact plug structure on the conductive pad structure; and a capacitor on the conductive pad structure, wherein the spacer structure includes an insulating material containing the n-type impurities.

19. The semiconductor device according to claim 18, wherein the impurity region includes silicon doped with phosphorous, and the spacer structure includes phosphorous silicate glass (PSG).

20. The semiconductor device according to claim 18, wherein the spacer structure includes a first spacer and a second spacer, the first spacer is on an outer sidewall of the second spacer, the first spacer includes the n-type impurities, and the second spacer covers the sidewall of the conductive filling pattern.

* * * * *